US012627221B2

(12) United States Patent
Okamoto et al.

(10) Patent No.: US 12,627,221 B2
(45) Date of Patent: May 12, 2026

(54) POWER SUPPLY SYSTEM, RADIO FREQUENCY SYSTEM, COMMUNICATION DEVICE, AND TRACKER MODULE

(71) Applicant: Murata Manufacturing Co., Ltd., Nagaokakyo (JP)

(72) Inventors: Sho Okamoto, Nagaokakyo (JP); Muneharu Kato, Nagaokakyo (JP); Kouji Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 246 days.

(21) Appl. No.: 18/602,648

(22) Filed: Mar. 12, 2024

(65) Prior Publication Data

US 2024/0313645 A1    Sep. 19, 2024

(30) Foreign Application Priority Data

Mar. 16, 2023    (JP) ................................. 2023-042412

(51) Int. Cl.
*H05K 1/14* (2006.01)
*H02M 3/00* (2006.01)
*H05K 1/181* (2026.01)

(52) U.S. Cl.
CPC .............. *H02M 3/003* (2021.05); *H05K 1/14* (2013.01); *H05K 1/181* (2013.01); *H05K 2201/1003* (2013.01); *H05K 2201/10053* (2013.01)

(58) Field of Classification Search
CPC ......... H02M 3/003; H05K 1/14; H05K 1/181; H05K 2201/1003; H05K 2201/10053
USPC ........................................ 361/782
See application file for complete search history.

(56) References Cited

U.S. PATENT DOCUMENTS

| | | | |
|---|---|---|---|
| 6,015,091 A * | 1/2000 | Rockstein | G06K 7/10 |
| | | | 235/462.46 |
| 2014/0132354 A1 | 5/2014 | Briffa et al. | |
| 2024/0203815 A1* | 6/2024 | Bader | H10D 84/08 |

* cited by examiner

*Primary Examiner* — Binh B Tran
(74) *Attorney, Agent, or Firm* — ArentFox Schiff LLP

(57) ABSTRACT

A power supply system is provided that includes a first board, a tracker module disposed at the first board, and a power inductor disposed at the first board. The tracker module includes a second board and at least one IC chip disposed at the second board. The at least one IC chip includes at least one switch included in a pre-regulator circuit, at least one switch included in a switched-capacitor circuit, and at least one switch included in a supply modulator. In a plan view in a thickness direction of the first board, the second board has a recess, and at least a portion of the power inductor is disposed in the recess.

20 Claims, 13 Drawing Sheets

FIG. 4

POWER SUPPLY SYSTEM, RADIO FREQUENCY SYSTEM, COMMUNICATION DEVICE, AND TRACKER MODULE

CROSS REFERENCE TO RELATED APPLICATIONS

This application claims priority to Japanese Patent Application No. 2023-042412, filed Mar. 16, 2023, the entire content of which is hereby incorporated by reference in its entirety.

TECHNICAL FIELD

The present disclosure relates to a power supply system, a radio frequency system, a communication device, and a tracker module, and more specifically, to a power supply system including a tracker module, a radio frequency system and a communication device including the power supply system, and the tracker module.

BACKGROUND

U.S. Patent Application Publication No. 2014/0132354 discloses a power supply modulation circuit capable of supplying a power supply voltage to a power amplifier. The power supply modulation circuit includes, for example, a pre-regulator circuit including a power inductor as a configuration for generating a plurality of discrete voltages.

When the power supply modulation circuit in U.S. Patent Application Publication No. 2014/0132354 is provided as a power supply system including a tracker module, it is difficult to reduce a size of the tracker module in a configuration in which the tracker module includes the power inductor included in the pre-regulator circuit. On the other hand, in a case where the power supply system includes the power inductor and the tracker module, each of the power inductor and the tracker module occupies a space, and thus it may be difficult to reduce the size of the power supply system.

SUMMARY OF THE INVENTION

Accordingly, it is an object of the present disclosure to provide a power supply system, a radio frequency system, a communication device, and a tracker module that is reduced in size.

In an exemplary aspect, a power supply system is provided that includes a first board, a tracker module, and a power inductor. The tracker module is disposed at the first board. The power inductor is disposed at the first board. The tracker module includes a second board and at least one IC chip. The at least one IC chip is disposed at the second board. Moreover, the at least one IC chip includes at least one switch included in a pre-regulator circuit, at least one switch included in a switched-capacitor circuit, and at least one switch included in a supply modulator. The pre-regulator circuit is configured to convert an input voltage into an adjustment voltage by using the power inductor. The switched-capacitor circuit is configured to generate a plurality of discrete voltages based on the adjustment voltage. The supply modulator is configured to selectively output at least one of the plurality of discrete voltages to a power amplifier. The second board has a recess in a plan view in a thickness direction of the first board. At least a portion of the power inductor is disposed in the recess in a plan view in the thickness direction of the first board.

In another exemplary aspect, a power supply system is provided that includes a first board, a tracker module, and a power inductor. The tracker module is disposed at the first board, and the power inductor is disposed at the first board. The tracker module includes a second board and at least one IC chip. The at least one IC chip is disposed at the second board. Moreover, the at least one IC chip includes at least one switch included in a pre-regulator circuit, at least one switch included in a switched-capacitor circuit, and at least one switch included in a supply modulator. The pre-regulator circuit is configured to convert an input voltage into an adjustment voltage by using the power inductor. The switched-capacitor circuit is configured to generate a plurality of discrete voltages based on the adjustment voltage. The supply modulator is configured to selectively output at least one of the plurality of discrete voltages to a power amplifier. In a plan view in a thickness direction of the first board, the tracker module and the power inductor face each other in a first direction and face a second direction. The first direction is perpendicular to the thickness direction of the first board. The second direction is perpendicular to the thickness direction of the first board and the first direction.

In another exemplary aspect, a radio frequency system of the present disclosure is provided that includes the power supply system and a power amplifier. The power amplifier is connected to the tracker module.

In another exemplary aspect, a communication device of the present disclosure is provided that includes the radio frequency system and a signal processing circuit. The signal processing circuit is connected to the radio frequency system.

In yet another exemplary aspect, a tracker module is provided that includes a module laminate and at least one IC chip. The at least one IC chip is disposed at the module laminate. The at least one IC chip includes at least one switch included in a pre-regulator circuit, at least one switch included in a switched-capacitor circuit, and at least one switch included in a supply modulator. The pre-regulator circuit is configured to convert an input voltage into an adjustment voltage by using a power inductor. The switched-capacitor circuit is configured to generate a plurality of discrete voltages based on the adjustment voltage. The supply modulator is configured to selectively output at least one of the plurality of discrete voltages to a power amplifier. The module laminate has a recess in a plan view in the thickness direction of the module laminate. At least a portion of the power inductor is disposed in the recess in a plan view in the thickness direction of the module laminate.

According to the power supply system, the radio frequency system, the communication device, and the tracker module according to the above aspects, the size of the power supply system is reduced.

BRIEF DESCRIPTION OF THE DRAWINGS

FIG. 4 is a circuit block diagram of a power supply circuit, a radio frequency system, and a communication device according to exemplary Embodiment 1;

DETAILED DESCRIPTION

Figure 1:
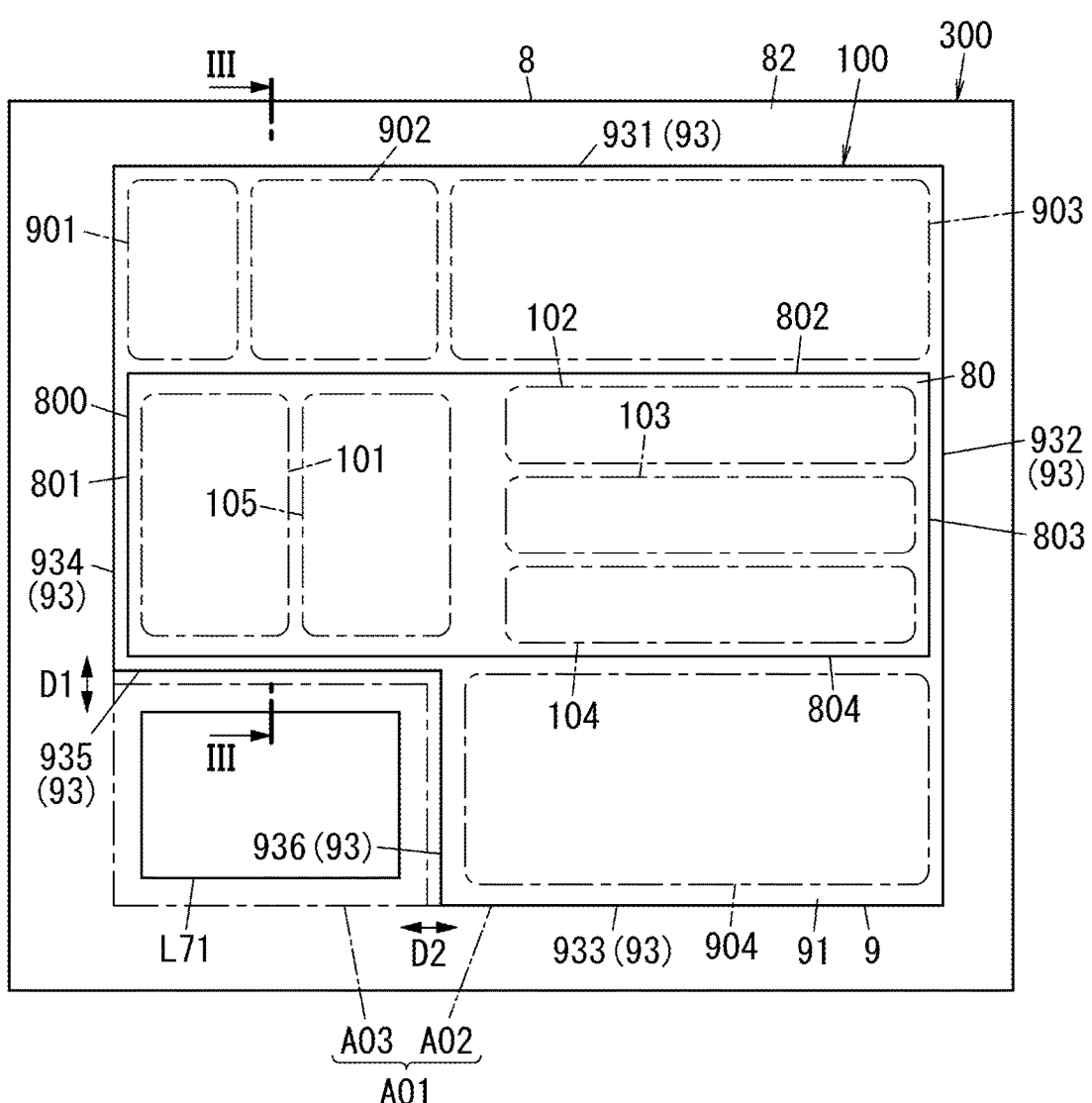
FIG. 1 is a plan view of a power supply system according to exemplary Embodiment 1.

Hereinafter, Exemplary Embodiments 1 to 9 will be described with reference to the drawings. It is noted that the drawings referred to in the following embodiments or the like are schematic drawings. The size and thickness of the component in the drawings do not necessarily reflect actual dimensions, and the ratio of the sizes and the ratio of the thicknesses between the components do not necessarily reflect the actual dimensional ratios.

Exemplary Embodiment 1

(1) Power Supply System

A power supply system 300 according to Embodiment 1 will be described with reference to the drawings.

As illustrated in FIG. 1, the power supply system 300 includes a first board 8, a tracker module 100 disposed at the first board 8, and a power inductor L71 disposed at the first board 8. The first board 8 is, for example, a motherboard of a communication device 7 (see FIG. 4) and is a printed wiring board.

Figure 2:
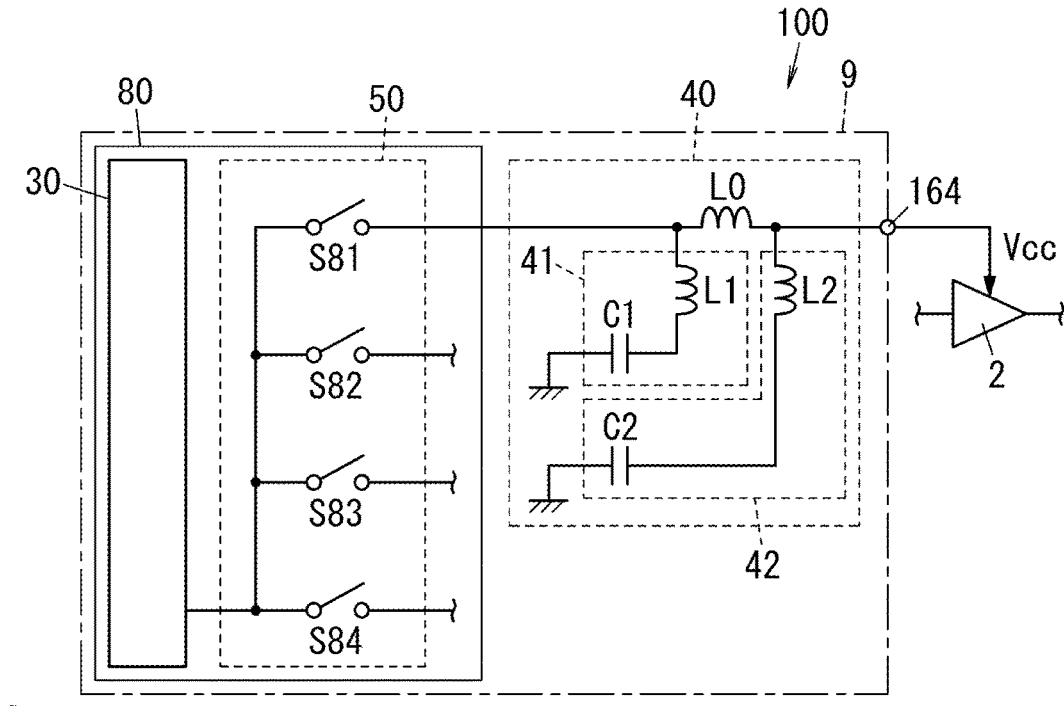
FIG. 2 is a conceptual diagram of the power supply system according to exemplary Embodiment 1.
Figure 3:
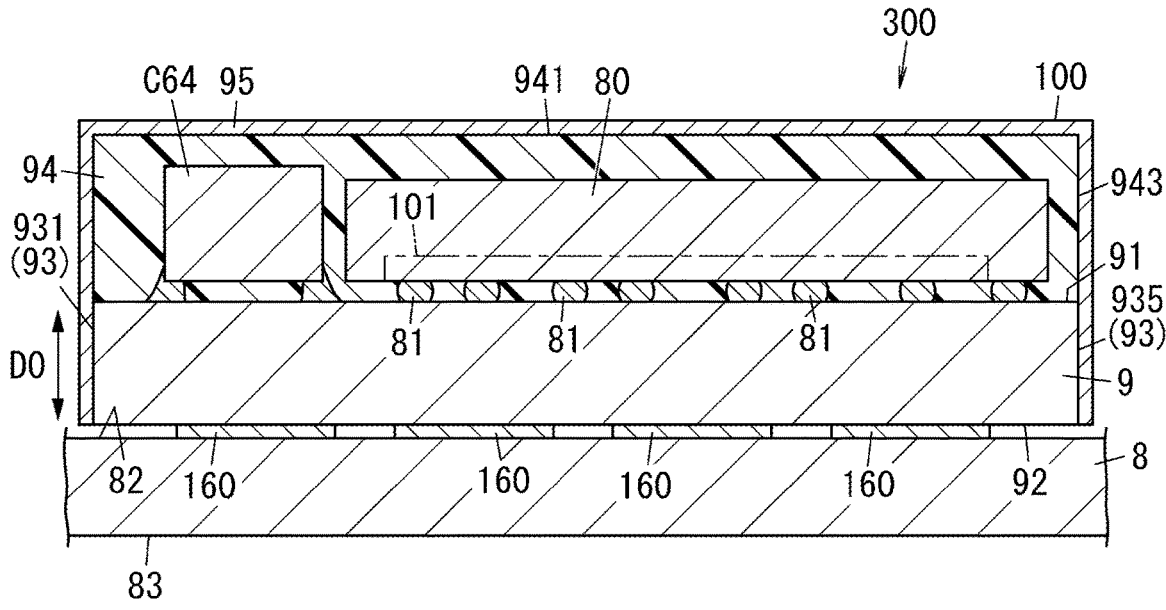
FIG. 3 illustrates the power supply system according to Embodiment 1, and is a cross-sectional view taken along line III-III in FIG. 1.

The tracker module 100 includes a second board 9, an IC chip 80, and a filter circuit 40 (see FIGS. 5 and 7), as illustrated in FIGS. 1 to 3. The second board 9 is, for example, a module laminate.

The IC chip 80 is disposed at the second board 9. The filter circuit 40 includes a plurality of functional elements (a plurality of inductors L0, L1, and L2 and a plurality of capacitors C1 and C2 in the illustrated example). The IC chip 80 includes at least one switch included in a switched-capacitor circuit 20 (see FIG. 6) and at least one switch included in a supply modulator 30 (see FIGS. 2 and 6). The switched-capacitor circuit 20 is configured to generate a plurality of discrete voltages based on an input voltage. The supply modulator 30 is configured to selectively output at least one of the plurality of discrete voltages to the filter circuit 40. The plurality of functional elements of the filter circuit 40 include at least one functional element integrated on the IC chip 80.

Figure 4:
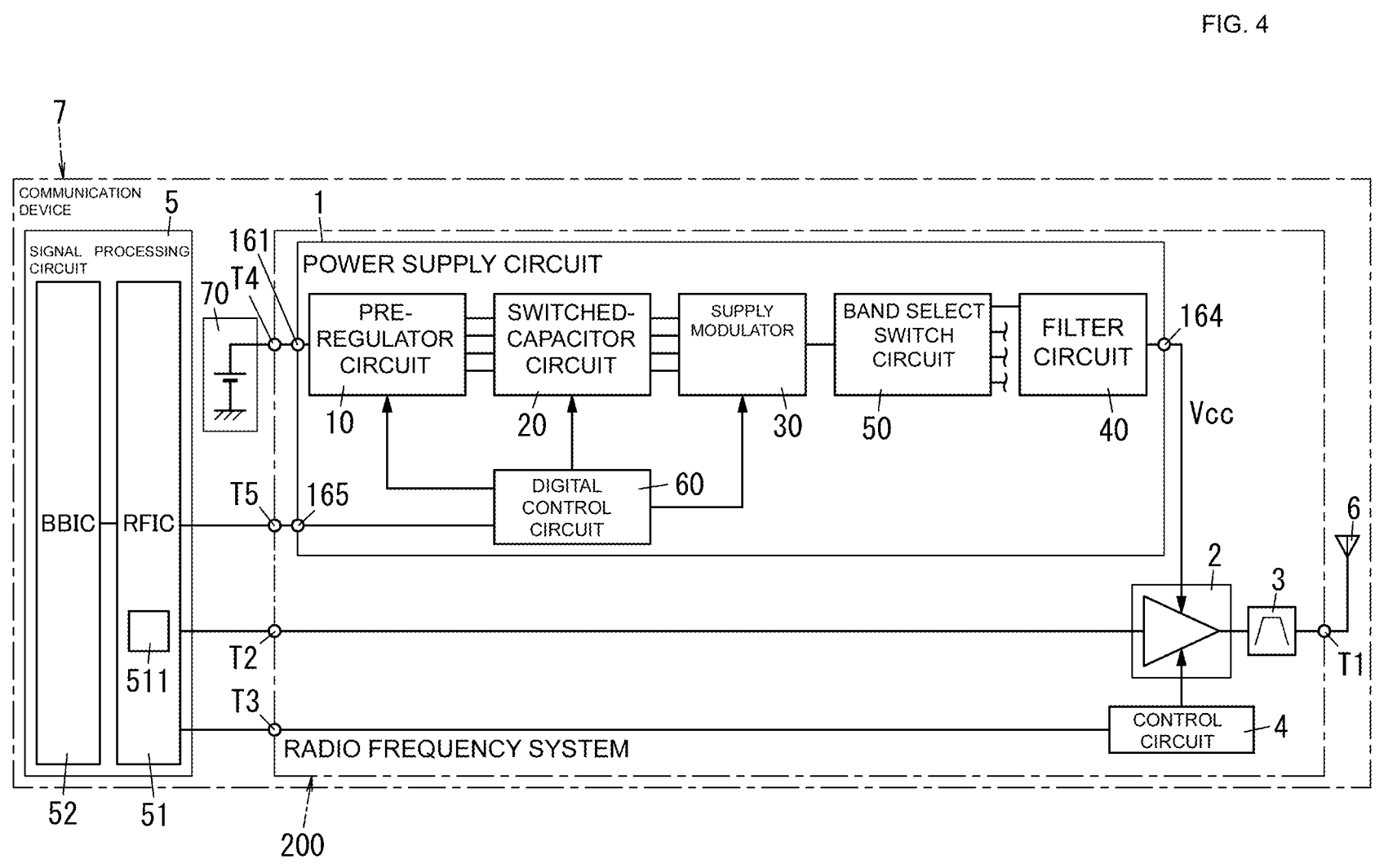

For example, as illustrated in FIG. 4, the power supply system 300 is configured to be connected to a direct current (DC) power source 70 provided in a communication device 7 and to supply a power supply voltage Vcc to a power amplifier 2 provided in the communication device 7.

(2) Circuit Configurations of Power Supply Circuit, Radio Frequency System, and Communication Device Circuit configurations of a power supply circuit 1, a radio frequency system 200, and the communication device 7 according to Embodiment 1 will be described with reference to the drawings.

(2.1) Circuit Configuration of Radio Frequency System

As illustrated in FIG. 4, the radio frequency system 200 includes the power supply circuit 1, a power amplifier 2, a filter 3, a control circuit 4, and a plurality of external connection terminals. The plurality of external connection terminals includes an antenna terminal T1, a signal input terminal T2, a first control terminal T3, a power source connection terminal T4, and four (only one is illustrated in FIG. 2) second control terminals T5.

The power supply circuit 1 is a circuit that supplies, to the power amplifier 2, a power supply voltage Vcc having a voltage level selected from a plurality of discrete voltage levels based on an envelope signal.

In the communication device 7 including the power supply circuit 1 and the power amplifier 2, an envelope tracking method (referred to as an "ET method" below) can be used when the power amplifier 2 amplifies a radio frequency signal. For purposes of this disclosure, the ET method includes an analog envelope tracking method (referred to as an "analog ET method" below) and a digital envelope tracking method (referred to as a "digital ET method" below).

The digital ET method is a method of tracking an envelope of a radio frequency signal (e.g., a modulated signal) by using a plurality of discrete voltages having different voltage levels within one frame. A mode in which the digital ET method is applied to generate the power supply voltage Vcc is referred to as a digital ET mode. The analog ET method is a method of tracking an envelope of a radio frequency signal by using a continuous voltage level. A mode in which the analog ET method is applied to generate the power supply voltage Vcc is referred to as an analog ET mode.

For purposes of this disclosure, a frame represents a unit forming a radio frequency signal. For example, in $5^{th}$ Generation New Radio (5G NR) and Long Term Evolution (LTE)®, a frame includes 10 subframes, each subframe includes a plurality of slots, and each slot includes a plurality of symbols. The subframe length is 1 ms, and the frame length is 10 ms.

Here, the digital ET mode and the analog ET mode will be described with reference to FIGS. 5A and 5B.

Figure 5A:
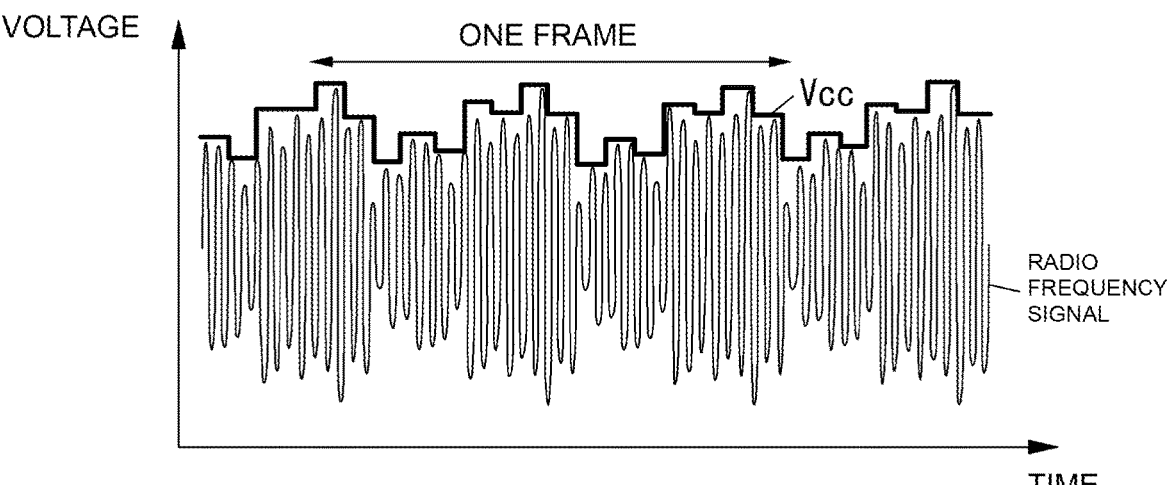
FIG. 5A is a waveform diagram illustrating an example of transition of a power supply voltage in a digital ET mode.

In the digital ET mode, as illustrated in FIG. 5A, the envelope of the radio frequency signal is tracked by causing the power supply voltage Vcc to fluctuate to a plurality of discrete voltage levels within one frame. As a result, the waveform of the power supply voltage Vcc becomes a rectangular waveform. In the digital ET mode, the power supply voltage level is selected from the plurality of discrete voltage levels based on the envelope signal.

Figure 5B:
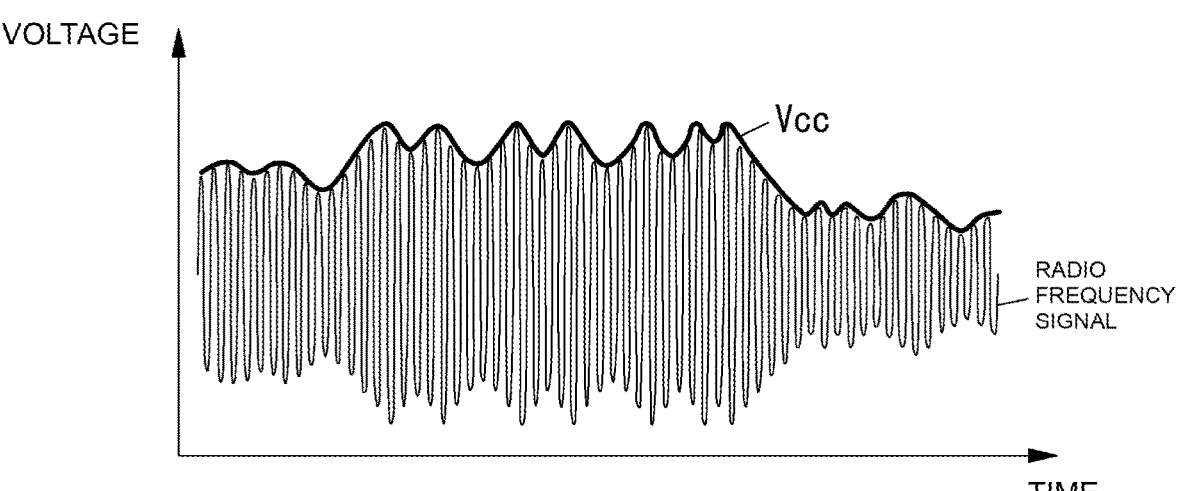
FIG. 5B is a waveform diagram illustrating an example of transition of the power supply voltage in an analog ET mode.

In the analog ET mode, as illustrated in FIG. 5B, the envelope of the radio frequency signal is tracked by causing the power supply voltage Vcc to continuously fluctuate. In the analog ET mode, the power supply voltage Vcc is determined based on the envelope signal. In the analog ET mode, when a channel bandwidth is narrow (in a case where the channel bandwidth is less than 60 MHz, for example), the power supply voltage Vcc easily follows the change in the envelope of the radio frequency signal, but when the channel bandwidth is wide (in a case where the channel bandwidth is equal to or more than, for example, 60 MHz), the power supply voltage Vcc has difficulty in following the change in the envelope of the radio frequency signal. In other words, when the channel bandwidth is wide, the amplitude change of the power supply voltage Vcc is likely to be delayed with respect to the change in the envelope of the radio frequency signal.

On the other hand, when the channel bandwidth is wide, the tracking ability of the power supply voltage Vcc to the radio frequency signal can be improved by applying the digital ET mode.

According to the exemplary aspect, the power supply circuit 1 includes a pre-regulator circuit 10, a switched-capacitor circuit 20, a supply modulator 30, and a filter circuit 40.

The pre-regulator circuit 10 is, for example, a direct current (DC)/DC converter that converts a DC voltage (e.g., a first voltage) supplied from the DC power source 70 provided in the communication device 7 into a second voltage. The pre-regulator circuit 10 is configured to perform a step-up operation of making the voltage value of the second voltage larger than the voltage value of the first voltage and a step-down operation of making the voltage value of the second voltage smaller than the voltage value of the first voltage. That is, the pre-regulator circuit 10 is a buck-boost DC-DC converter.

The switched-capacitor circuit 20 is configured to generate a plurality of discrete voltages (plurality of third voltages) by using the second voltage from the pre-regulator circuit 10 as an input voltage. The plurality of discrete voltages has voltage levels different from each other. The switched-capacitor circuit 20 may be referred to as a switched-capacitor voltage balancer.

The supply modulator 30 is configured to selectively output, to the filter circuit 40, at least one of the plurality of discrete voltages (plurality of third voltages) generated by the switched-capacitor circuit 20 based on a digital control signal corresponding to the envelope signal. The supply modulator 30 outputs at least one discrete voltage selected from the plurality of discrete voltages. In the power supply circuit 1, the voltage level of an output voltage (e.g., power supply voltage Vcc) of the supply modulator 30 can be changed with time by repeating the selection of the discrete voltage in the supply modulator 30 with time. Thus, the power supply circuit 1 can change the voltage level of the power supply voltage Vcc supplied to the power amplifier 2 with time.

The filter circuit 40 filters the output voltage of the supply modulator 30. The filter circuit 40 includes, for example, a low pass filter.

The filter circuit 40 reduces the amplitude of a spike-shaped voltage of the output voltage output from the supply modulator 30. That is, the power supply circuit 1 includes the filter circuit 40, and thus can reduce the waveform distortion of the output voltage output from the supply modulator 30. Thus, it is possible to reduce a radio frequency component of the output voltage. As a result, in the power supply circuit 1, it is possible to reduce noise included in the power supply voltage Vcc, and thus it is possible to reduce noise that enters the power amplifier 2 from the power supply circuit 1.

The power amplifier 2 has an input terminal, an output terminal, a power supply terminal, and a control terminal. The input terminal of the power amplifier 2 is connected to the signal processing circuit 5 of the communication device 7 through the signal input terminal T2. The output terminal of the power amplifier 2 is connected to an antenna 6 of the communication device 7 through the filter 3 and the antenna terminal T1. The power amplifier 2 amplifies a radio frequency transmission signal (referred to as a transmission signal below) in a predetermined band, which is outputted from the signal processing circuit 5 and outputs the amplified signal.

The filter 3 is connected between the output terminal of the power amplifier 2 and the antenna terminal T1. The filter 3 has a passband that includes a frequency band of a predetermined band. Thus, the filter 3 can cause the transmission signal in the predetermined band amplified by the power amplifier 2 to pass through the filter 3. In the radio frequency system 200, the transmission signal output from the power amplifier 2 is output to the antenna 6 through the filter 3 and the antenna terminal T1.

The control circuit 4 is connected to an RF signal processing circuit 51 of the signal processing circuit 5 through the first control terminal T3. The control circuit 4 is connected to the control terminal of the power amplifier 2. The control circuit 4 controls the magnitude and a supply timing of a bias current (or bias voltage) to be supplied to the control terminal of the power amplifier 2 by receiving a control signal from the RF signal processing circuit 51 of the signal processing circuit 5.

(2.2) Communication Device

As illustrated in FIG. 4, the communication device 7 includes the radio frequency system 200, the signal processing circuit 5, the antenna 6, and the DC power source 70.

The DC power source 70 is, for example, a rechargeable battery. The DC power source 70 is not limited to the rechargeable battery, and may be another battery in an alternative aspect.

The antenna 6 transmits a transmission signal in a predetermined band output from the antenna terminal T1.

The signal processing circuit 5 includes the RF signal processing circuit 51 and a baseband signal processing circuit 52. The RF signal processing circuit 51 is, for example, a radio frequency integrated circuit (RF IC) and performs signal processing on a radio frequency signal. For example, the RF signal processing circuit 51 performs signal processing, such as upconverting, on a radio frequency signal (transmission signal) outputted from the baseband signal processing circuit 52, and outputs the radio frequency signal subjected to the signal processing. The baseband signal processing circuit 52 is, for example, a baseband integrated circuit (BB IC). The baseband signal processing circuit 52 generates an I phase signal and a Q phase signal from a baseband signal. The baseband signal is, for example, an audio signal or an image signal inputted from the outside. The baseband signal processing circuit 52 performs IQ modulation processing by combining the I phase signal and the Q phase signal, and outputs the transmission signal. At this time, the transmission signal is generated as a modulation signal (e.g., an IQ signal) in which a carrier wave signal of a predetermined frequency is amplitude-modulated in a period longer than a period of the carrier wave signal.

The RF signal processing circuit 51 includes a control unit 511 that controls the power supply circuit 1 and the power amplifier 2. The control unit 511 of the RF signal processing circuit 51 causes the supply modulator 30 to select the voltage level of the power supply voltage Vcc used in the power amplifier 2 from the voltage levels of the plurality of discrete voltages generated by the switched-capacitor circuit 20, based on the envelope signal of the radio frequency input signal input from the baseband signal processing circuit 52. Thus, the power supply circuit 1 outputs the power supply voltage Vcc based on the digital envelope tracking. The envelope signal is a signal indicating an envelope of a radio frequency signal (e.g., a modulated signal). The envelope value is, for example, $(I^2+Q^2)^{1/2}$. Here, (I, Q) represents a constellation point. The constellation point is a point representing a signal modulated by digital modulation on a constellation diagram. (I, Q) is determined by the baseband signal processing circuit 52, for example, based on transmission information. Some or all of the functions of the RF signal processing circuit 51 as the control unit 511 may be outside the RF signal processing circuit 51. For example, the baseband signal processing circuit 52 or the power supply circuit 1 may include some or all of the functions of the RF signal processing circuit 51 as the control unit 511. For example, the control function that causes the supply modulator 30 to select the voltage level of the power supply voltage Vcc does not need to be provided in the RF signal processing circuit 51, but may be provided in the power supply circuit 1.

(2.3) Power Supply Circuit

Figure 6:
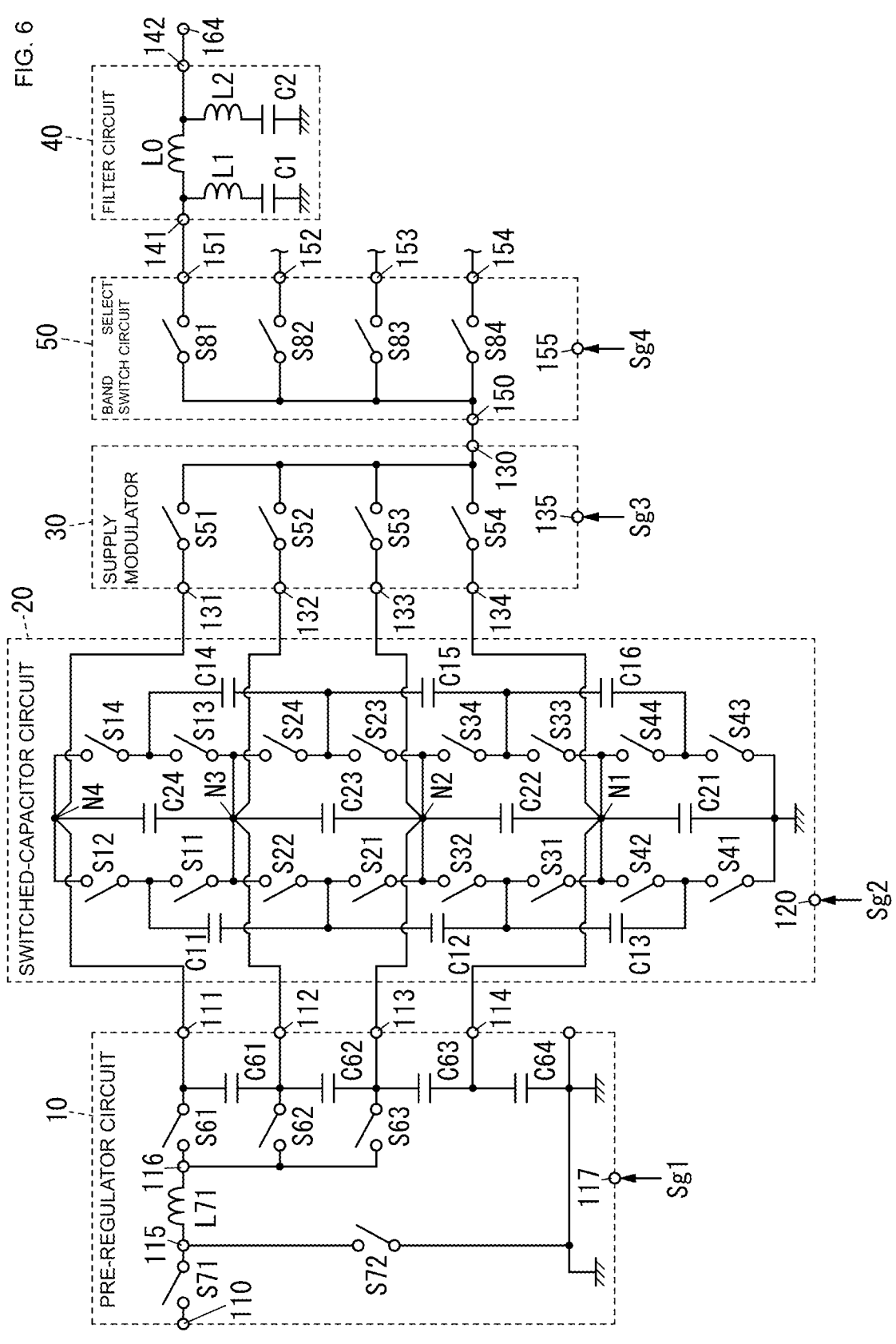
FIG. 6 is a circuit diagram of the power supply circuit according to exemplary Embodiment 1.

As illustrated in FIG. 6, the power supply circuit 1 includes a pre-regulator circuit 10, a switched-capacitor circuit 20, a supply modulator 30, a filter circuit 40, a band select switch circuit 50, and a digital control circuit 60.

(2.4) Pre-Regulator Circuit

As illustrated in FIG. 6, the pre-regulator circuit 10 includes an input terminal 110, a plurality (four in the example of FIG. 6) of output terminals 111 to 114, a plurality of inductor connection terminals 115 and 116, a control terminal 117, and a plurality (five in the example of FIG. 6) of switches S61, S62, S63, S71, and S72, a power inductor L71, and a plurality (four in the example of FIG. 6) of capacitors C61, C62, C63, and C64. The power inductor L71 is an inductor used to step up and/or step down a DC voltage (step-up, step-down, or step-up/down).

The input terminal 110 is an input terminal of a DC voltage. That is, the input terminal 110 is a terminal for receiving an input voltage from the DC power source 70 (see FIG. 4).

The output terminal 111 is an output terminal of a voltage V4. That is, the output terminal 111 is a terminal for supplying the voltage V4 to the switched-capacitor circuit 20. The output terminal 111 is connected to a node N4 of the switched-capacitor circuit 20.

The output terminal 112 is an output terminal of a voltage V3. That is, the output terminal 112 is a terminal for supplying the voltage V3 to the switched-capacitor circuit 20. The output terminal 112 is connected to a node N3 of the switched-capacitor circuit 20.

The output terminal 113 is an output terminal of a voltage V2. That is, the output terminal 113 is a terminal for supplying the voltage V2 to the switched-capacitor circuit 20. The output terminal 113 is connected to a node N2 of the switched-capacitor circuit 20.

The output terminal 114 is an output terminal of a voltage V1. That is, the output terminal 114 is a terminal for supplying the voltage V1 to the switched-capacitor circuit 20. The output terminal 114 is connected to a node N1 of the switched-capacitor circuit 20.

The inductor connection terminal 115 is connected to one end (e.g., the first end) of the power inductor L71. The inductor connection terminal 116 is connected to the other end (e.g., the second end) of the power inductor L71.

The control terminal 117 is an input terminal of a control signal Sg1. That is, the control terminal 117 is a terminal for receiving the control signal Sg1 for controlling the pre-regulator circuit 10. The control signal Sg1 is a signal for controlling on/off of the plurality of switches S61 to S63, S71, and S72 included in the pre-regulator circuit 10.

The switch S71 is connected between the input terminal 110 and one end (e.g., the first end) of the power inductor L71. Specifically, the switch S71 has a first terminal that is connected to the input terminal 110 and a second terminal that is connected to one end (e.g., the first end) of the power inductor L71 through the inductor connection terminal 115. In the above connection configuration, the switch S71 performs switching between connection and disconnection between the input terminal 110 and one end of the power inductor L71 by performing switching between on and off.

The switch S72 is connected between the one end (e.g., the first end) of the power inductor L71 and the ground. Specifically, the switch S72 has a first terminal that is connected to the one end (e.g., the first end) of the power inductor L71 via the inductor connection terminal 115 and a second terminal that is connected to the ground. In the above connection configuration, the switch S72 performs switching between connection and disconnection between the one end of the power inductor L71 and the ground by performing switching between on and off.

The switch S61 is connected between the other end (e.g., the second end) of the power inductor L71 and the output terminal 111. Specifically, the switch S61 has a first terminal that is connected to the other end (e.g., the second end) of the power inductor L71 and a second terminal that is connected to the output terminal 111. In the above connection configuration, the switch S61 performs switching between connection and disconnection between the other end of the power inductor L71 and the output terminal 111 by performing switching between on and off.

The switch S62 is connected between the other end (e.g., the second end) of the power inductor L71 and the output terminal 112. Specifically, the switch S62 has a first terminal that is connected to the other end (e.g., the second end) of the power inductor L71 and a second terminal that is connected to the output terminal 112. In the above connection configuration, the switch S62 performs switching between connection and disconnection between the other end of the power inductor L71 and the output terminal 112 by performing switching between on and off.

The switch S63 is connected between the other end (e.g., the second end) of the power inductor L71 and the output terminal 113. Specifically, the switch S63 has a first terminal that is connected to the other end (e.g., the second end) of the power inductor L71 and a second terminal that is connected to the output terminal 113. In the above connection configuration, the switch S63 is configured to perform switching between connection and disconnection between the other end of the power inductor L71 and the output terminal 113 by performing switching between on and off.

The capacitor C61 is connected between the output terminal 111 and the output terminal 112. One of two electrodes of the capacitor C61 is connected to the switch S61 and the output terminal 111, and the other of the two electrodes of the capacitor C61 is connected to the switch S62 and the output terminal 112, and one of two electrodes of the capacitor C62.

The capacitor C62 is connected between the output terminal 112 and the output terminal 113. One of the two electrodes of the capacitor C62 is connected to the switch S62 and the output terminal 112, and the other of the two electrodes of the capacitor C61. The other of the two electrodes of the capacitor C62 is connected to the switch S63 and the output terminal 113, and one of two electrodes of the capacitor C63.

The capacitor C63 is connected between the output terminal 113 and the output terminal 114. One of the two electrodes of the capacitor C63 is connected to the switch S63 and the output terminal 113, and the other of the two electrodes of the capacitor C62. The other of the two electrodes of the capacitor C63 is connected to the output terminal 114 and one of two electrodes of the capacitor C64.

The capacitor C64 is connected between the output terminal 114 and the ground. One of the two electrodes of the capacitor C64 is connected to the output terminal 114 and the other of the two electrodes of the capacitor C63. The other of the two electrodes of the capacitor C64 is connected to the ground.

The plurality of switches S61 to S63 are controlled to be exclusively turned on. That is, only one of the switches S61 to S63 is turned on, and the rest of the switches S61 to S63 are turned off. The voltage levels of the voltages V1 to V4 can be changed depending on which of the switches S61 to S63 are turned on.

The pre-regulator circuit 10 configured as described above supplies charges to the switched-capacitor circuit 20 through at least one of the plurality of output terminals 111 to 113.

(2.5) Switched-Capacitor Circuit

As illustrated in FIG. 6, the switched-capacitor circuit 20 includes a plurality (six in the example of FIG. 6) of capacitors C11 to C16, a plurality (four in the example of FIG. 6) of capacitors C21 to C24, and a plurality (sixteen in the example of FIG. 6), of switches S11 to S14, S21 to S24, S31 to S34, and S41 to S44, and a control terminal 120.

The control terminal 120 is an input terminal of a control signal Sg2 from the digital control circuit 60. The control signal Sg2 is a signal for controlling on/off of the plurality of switches S11 to S14, S21 to S24, S31 to S34, and S41 to S44 included in the switched-capacitor circuit 20.

Each of the plurality of capacitors C11 to C16 functions as a flying capacitor (e.g., a transfer capacitor). That is, each of the plurality of capacitors C11 to C16 is used to step up or step down the voltage (input voltage) supplied from the pre-regulator circuit 10. More specifically, the plurality of capacitors C11 to C16 move charges between the capacitors C11 to C16 and the nodes N1 to N4 so that the voltages V1 to V4 (voltage with respect to the ground potential) that satisfy V1:V2:V3:V4=1:2:3:4 at the four nodes N1 to N4. The plurality of voltages V1 to V4 correspond to a plurality of discrete voltages having a plurality of discrete voltage levels, respectively. The voltage V1 is a voltage at the node N1, the voltage V2 is a voltage at the node N2, the voltage V3 is a voltage at the node N3, and the voltage V4 is a voltage at the node N4.

The capacitor C11 has two electrodes. One of the two electrodes of the capacitor C11 is connected to one end (e.g., the first end) of the switch S11 and one end (e.g., the first end) of the switch S12. The other of the two electrodes of the capacitor C11 is connected to one end (e.g., the first end) of the switch S21 and one end (e.g., the first end) of the switch S22.

The capacitor C12 has two electrodes. One of the two electrodes of the capacitor C12 is connected to the one end (e.g., the first end) of the switch S21 and the one end (e.g., the first end) of the switch S22. The other of the two electrodes of the capacitor C12 is connected to one end (e.g., the first end) of the switch S31 and one end (e.g., the first end) of the switch S32.

In the switched-capacitor circuit 20, the capacitor C12 is an example of a first capacitor, one of the two electrodes of the capacitor C12 configures a first electrode of the first capacitor, and the other of the two electrodes of the capacitor C12 configures a second electrode of the first capacitor.

The capacitor C13 has two electrodes. One of the two electrodes of the capacitor C13 is connected to one end (e.g., the first end) of the switch S31 and one end (e.g., the first end) of the switch S32. The other of the two electrodes of the capacitor C13 is connected to one end (e.g., the first end) of the switch S41 and one end (e.g., the first end) of the switch S42.

The capacitor C14 has two electrodes. One of the two electrodes of the capacitor C14 is connected to one end (e.g., the first end) of the switch S13 and one end (e.g., the first end) of the switch S14. The other of the two electrodes of the capacitor C14 is connected to one end (e.g., the first end) of the switch S23 and one end (e.g., the first end) of the switch S24.

The capacitor C15 has two electrodes. One of the two electrodes of the capacitor C15 is connected to the one end (e.g., the first end) of the switch S23 and the one end (e.g., the first end) of the switch S24. The other of the two electrodes of the capacitor C15 is connected to one end (e.g., the first end) of the switch S33 and one end (e.g., the first end) of the switch S34.

In the switched-capacitor circuit 20, the capacitor C15 is an example of a second capacitor, one of the two electrodes of the capacitor C15 configures a third electrode of the second capacitor, and the other of the two electrodes of the capacitor C15 configures a fourth electrode of the second capacitor.

The capacitor C16 has two electrodes. One of the two electrodes of the capacitor C16 is connected to the one end (e.g., the first end) of the switch S33 and the one end (e.g., the first end) of the switch S34. The other of the two electrodes of the capacitor C16 is connected to one end (e.g., the first end) of the switch S43 and one end (e.g., the first end) of the switch S44.

Each of a set of the capacitors C11 and C14, a set of the capacitors C12 and C15, and a set of the capacitors C13 and C16 can be complementarily charged and discharged by repeating a first phase and a second phase.

In the first phase, the switches S12, S13, S22, S23, S32, S33, S42, and S43 are turned on. As a result, for example, one (first electrode) of the two electrodes of the capacitor C12 (first capacitor) is connected to the node N3. The other (second electrode) of the two electrodes of the capacitor C12 and one (third electrode) of the two electrodes of the capacitor C15 (second capacitor) is connected to the node N2. The other (fourth electrode) of the two electrodes of the capacitor C15 is connected to the node N1.

In the second phase, the switches S11, S14, S21, S24, S31, S34, S41, and S44 are turned on. As a result, for example, one (third electrode) of the two electrodes of the capacitor C15 (second capacitor) is connected to the node N3. The other (fourth electrode) of the two electrodes of the capacitor C15 (second capacitor) and one (first electrode) of the two electrodes of the capacitor C12 (first capacitor) are connected to the node N2. The other (second electrode) of the two electrodes of the capacitor C12 (first capacitor) is connected to the node N1.

By repeating the first phase and the second phase, for example, when one of the capacitors C12 and C15 is charged from the node N2, the other of the capacitors C12 and C15 can be discharged to the capacitor C23. That is, the capacitors C12 and C15 can be complementarily charged and discharged during operation. According to an exemplary aspect, the capacitors C12 and C15 are a pair of flying capacitors that are complementarily charged and discharged.

Similarly to the set of the capacitors C12 and C15, the set of the capacitors C11 and C14 are a pair of flying capacitors that are complementarily charged from the node and discharged to a smoothing capacitor, by appropriately switching the switch. Similarly to the set of the capacitors C12 and C15, the set of the capacitors C13 and C16 are a pair of flying capacitors that are complementarily charged from the node and discharged to a smoothing capacitor, by appropriately switching the switch.

Each of the plurality of capacitors C21 to C24 functions as a smoothing capacitor. That is, the capacitors C21 to C24 are used to hold and smooth the voltages V1 to V4 at the nodes N1 to N4, respectively.

The capacitor C21 is connected between the node N1 and the ground. Specifically, one of the two electrodes of the capacitor C21 is connected to the node N1. On the other hand, the other (sixth electrode) of the two electrodes of the capacitor C21 is connected to the ground.

The capacitor C22 is connected between the node N2 and the node N1. Specifically, one of the two electrodes of the capacitor C22 is connected to the node N2. On the other hand, the other of the two electrodes of the capacitor C22 is connected to the node N1.

The capacitor C23 is connected between the node N3 and the node N2. Specifically, one of the two electrodes of the capacitor C23 is connected to the node N3. On the other hand, the other of the two electrodes of the capacitor C23 is connected to the node N2.

The capacitor C24 is connected between the node N4 and the node N3. Specifically, one of the two electrodes of the capacitor C24 is connected to the node N4. On the other hand, the other of the two electrodes of the capacitor C24 is connected to the node N3.

The switch S11 is connected between one of the two electrodes of the capacitor C11 and the node N3. Specifically, the one end (e.g., the first end) of the switch S11 is connected to one of the two electrodes of the capacitor C11. On the other hand, the other end (e.g., the second end) of the switch S11 is connected to the node N3.

The switch S12 is connected between one of the two electrodes of the capacitor C11 and the node N4. Specifically, the one end (e.g., the first end) of the switch S12 is connected to one of the two electrodes of the capacitor C11. On the other hand, the other end (e.g., the second end) of the switch S12 is connected to the node N4.

The switch S21 is connected between one (first electrode) of the two electrodes of the capacitor C12 (first capacitor) and the node N2. Specifically, the one end (e.g., the first end) of the switch S21 is connected to the one (first electrode) of the two electrodes of the capacitor C12 (first capacitor) and the other of the two electrodes of the capacitor C11. On the other hand, the other end (e.g., the second end) of the switch S21 is connected to the node N2. In the switched-capacitor circuit 20, the switch S21 is an example of a first switch.

The switch S22 is connected between one (first electrode) of the two electrodes of the capacitor C12 and the node N3. Specifically, the one end (e.g., the first end) of the switch S22 is connected to one (first electrode) of the two electrodes of the capacitor C12 and the other of the two electrodes of the capacitor C11. On the other hand, the other end (e.g., the second end) of the switch S22 is connected to the node N3. In the switched-capacitor circuit 20, the switch S22 is an example of a third switch.

The switch S31 is connected between the other (second electrode) of the two electrodes of the capacitor C12 (first capacitor) and the node N1. Specifically, the one end (e.g., the first end) of the switch S31 is connected to the other (second electrode) of the two electrodes of the capacitor C12 (first capacitor) and one of the two electrodes of the capacitor C13. On the other hand, the other end (e.g., the second end) of the switch S31 is connected to the node N1. In the switched-capacitor circuit 20, the switch S31 is an example of a fourth switch.

The switch S32 is connected between the other (second electrode) of the two electrodes of the capacitor C12 (first capacitor) and the node N2. Specifically, one end (e.g., the first end) of the switch S32 is connected to the other (second electrode) of the two electrodes of the capacitor C12 and one of the two electrodes of the capacitor C13. On the other hand, the other end (e.g., the second end) of the switch S32 is connected to the node N2. That is, the other end (e.g., the second end) of the switch S32 is connected to the other end (e.g., the second end) of the switch S21. In the switched-capacitor circuit 20, the switch S32 is an example of a second switch.

The switch S41 is connected between the other of the two electrodes of the capacitor C13 and the ground. Specifically, the one end (e.g., the first end) of the switch S41 is connected to the other of the two electrodes of the capacitor C13. On the other hand, the other end (e.g., the second end) of the switch S41 is connected to the ground.

The switch S42 is connected between the other of the two electrodes of the capacitor C13 and the node N1. Specifically, the one end (e.g., the first end) of the switch S42 is connected to the other of the two electrodes of the capacitor C13. On the other hand, the other end (e.g., the second end) of the switch S42 is connected to the node N1. That is, the other end (e.g., the second end) of the switch S42 is connected to the other end (e.g., the second end) of the switch S31.

The switch S13 is connected between one of the two electrodes of the capacitor C14 and the node N3. Specifically, one end (e.g., the first end) of the switch S13 is connected to one of the two electrodes of the capacitor C14. On the other hand, the other end (e.g., the second end) of the switch S13 is connected to the node N3. That is, the other end (e.g., the second end) of the switch S13 is connected to the other end (e.g., the second end) of the switch S11 and the other end (e.g., the second end) of the switch S22.

The switch S14 is connected between one of the two electrodes of the capacitor C14 and the node N4. Specifically, the one end (e.g., the first end) of the switch S14 is connected to one of the two electrodes of the capacitor C14. On the other hand, the other end (e.g., the second end) of the switch S14 is connected to the node N4. That is, the other end (e.g., the second end) of the switch S14 is connected to the other end (e.g., the second end) of the switch S12.

The switch S23 is connected between one (third electrode) of the two electrodes of the capacitor C15 (second capacitor) and the node N2. Specifically, the one end (e.g., the first end) of the switch S23 is connected to one (third electrode) of the two electrodes of the capacitor C15 and the other of the two electrodes of the capacitor C14. On the other hand, the other end (e.g., the second end) of the switch S23 is connected to the node N2. That is, the other end (e.g., the second end) of the switch S23 is connected to the other end (e.g., the second end) of the switch S21 and the other end (e.g., the second end) of the switch S32. In the switched-capacitor circuit 20, the switch S23 is an example of a fifth switch.

The switch S24 is connected between one (third electrode) of the two electrodes of the capacitor C15 (second capacitor) and the node N3. Specifically, the one end (e.g., the first end) of the switch S24 is connected to one (third electrode) of the two electrodes of the capacitor C15 and the other of the two electrodes of the capacitor C14. On the other hand, the other end (e.g., the second end) of the switch S24 is connected to the node N3. That is, the other end (e.g., the second end) of the switch S24 is connected to the other end (e.g., the second end) of the switch S11, the other end (e.g., the second end) of the switch S22, and the other end (e.g., the second end) of the switch S13. In the switched-capacitor circuit 20, the switch S24 is an example of a seventh switch.

The switch S33 is connected between the other of the two electrodes of the capacitor C15 (second capacitor) and the node N1. Specifically, the one end (e.g., the first end) of the switch S33 is connected to the other (fourth electrode) of the two electrodes of the capacitor C15 and one of the two electrodes of the capacitor C16. On the other hand, the other end (e.g., the second end) of the switch S33 is connected to the node N1. That is, the other end (e.g., the second end) of the switch S33 is connected to the other end (e.g., the second end) of the switch S31 and the other end (e.g., the second end) of the switch S42. In the switched-capacitor circuit 20, the switch S33 is an example of an eighth switch.

The switch S34 is connected between the other (fourth electrode) of the two electrodes of the capacitor C15 (second capacitor) and the node N2. Specifically, the one end (e.g., the first end) of the switch S34 is connected to the other (fourth electrode) of the two electrodes of the capacitor C15 and one of the two electrodes of the capacitor C16. On the other hand, the other end (e.g., the second end) of the switch S34 is connected to the node N2. That is, the other end (e.g., the second end) of the switch S34 is connected to the other end (e.g., the second end) of the switch S21, the other end (e.g., the second end) of the switch S32, and the other end (e.g., the second end) of the switch S23. In the switched-capacitor circuit 20, the switch S34 is an example of a sixth switch.

The switch S43 is connected between the other of the two electrodes of the capacitor C16 and the ground. Specifically, the one end (e.g., the first end) of the switch S43 is connected to the other of the two electrodes of the capacitor C16. On the other hand, the other end (e.g., the second end) of the switch S43 is connected to the ground.

The switch S44 is connected between the other of the two electrodes of the capacitor C16 and the node N1. Specifically, the one end (e.g., the first end) of the switch S44 is connected to the other of the two electrodes of the capacitor C16. On the other hand, the other end (e.g., the second end) of the switch S44 is connected to the node N1. That is, the other end (e.g., the second end) of the switch S44 is connected to the other end (e.g., the second end) of the switch S31, the other end (e.g., the second end) of the switch S42, and the other end (e.g., the second end) of the switch S33.

On and off are complementarily switched between a first set of switches including the switches S12, S13, S22, S23, S32, S33, S42, and S43 and a second set of switches including the switches S11, S14, S21, S24, S31, S34, S41, and S44. Specifically, in the first phase, the first set of switches is turned on, and the second set of switches is turned off. Conversely, in the second phase, the first set of switches is turned off, and the second set of switches is turned on.

For example, charging from the capacitors C11 to C13 to the capacitors C21 to C24 is performed in one of the first phase and the second phase, and charging from the capacitors C14 to C16 to the capacitors C21 to C24 is performed in the other of the first phase and the second phase. That is, the capacitors C21 to C24 are normally charged from the capacitors C11 to C13 or the capacitors C14 to C16. Thus, even though a current flows from the nodes N1 to N4 to the supply modulator 30 at a high speed, it is possible to suppress the potential fluctuations of the nodes N1 to N4 because the charges are replenished at the nodes N1 to N4 at a high speed.

By operating as described above, the switched-capacitor circuit 20 can maintain substantially the same voltage at both ends of each of the capacitors C21 to C24. Specifically, the voltages V1 to V4 (voltage with respect to the ground potential) that satisfy $V1:V2:V3:V4=1:2:3:4$ are maintained at the four nodes N1 to N4. The voltage levels of the voltages V1 to V4 correspond to a plurality of discrete voltage levels supplied to the supply modulator 30 by the switched-capacitor circuit 20.

The voltage ratio $V1:V2:V3:V4$ is not limited to $1:2:3:4$. For example, the voltage ratio $V1:V2:V3:V4$ may be $1:2:4:8$.)

(2.6) Supply Modulator

As illustrated in FIG. 6, the supply modulator 30 includes a plurality (four in the example of FIG. 6) of input terminals 131 to 134, a plurality (four in the example of FIG. 6) of switches S51 to S54, an output terminal 130, and a control terminal 135.

The output terminal 130 is connected to the filter circuit 40. The output terminal 130 is a terminal for supplying a voltage selected from the voltages V1 to V4 to the power amplifier 2 through the filter circuit 40 as the power supply voltage Vcc.

The plurality of input terminals 131 to 134 are connected to the nodes N4 to N1 of the switched-capacitor circuit 20, respectively. The plurality of input terminals 131 to 134 are terminals for receiving the voltages V4 to V1 from the switched-capacitor circuit 20.

The control terminal 135 is an input terminal of a control signal Sg3 from the digital control circuit 60. The control signal Sg3 is a signal for controlling on/off of the plurality of switches S51 to S54 included in the supply modulator 30. The supply modulator 30 controls on/off of the plurality of switches S51 to S54 based on the control signal Sg3.

The switch S51 is connected between the input terminal 131 and the output terminal 130. Specifically, the switch S51 has a first terminal that is connected to the input terminal 131 and a second terminal that is connected to the output terminal 130. In the above connection configuration, the switch S51 performs switching between the connection and the disconnection between the input terminal 131 and the output terminal 130 by performing switching between on and off.

The switch S52 is connected between the input terminal 132 and the output terminal 130. Specifically, the switch S52 has a first terminal that is connected to the input terminal 132 and a second terminal that is connected to the output terminal 130. In the above connection configuration, the switch S52 performs switching between the connection and the disconnection between the input terminal 132 and the output terminal 130 by performing switching between on and off. In the supply modulator 30, the switch S52 is an example of a tenth switch.

The switch S53 is connected between the input terminal 133 and the output terminal 130. Specifically, the switch S53 has a first terminal that is connected to the input terminal 133 and a second terminal that is connected to the output terminal 130. In the above connection configuration, the switch S53 performs switching between the connection and the disconnection between the input terminal 133 and the output terminal 130 by performing switching between on and off. In the supply modulator 30, the switch S53 is an example of a ninth switch.

The switch S54 is connected between the input terminal 134 and the output terminal 130. Specifically, the switch S54 has a first terminal that is connected to the input terminal 134 and a second terminal that is connected to the output terminal 130. In the above connection configuration, the switch S54 performs switching between the connection and the disconnection between the input terminal 134 and the output terminal 130 by performing switching between on and off.

The plurality of switches S51 to S54 are controlled to be exclusively turned on. That is, only one of the switches S51 to S54 is turned on, and the rest of the switches S51 to S54 are turned off. As a result, the supply modulator 30 can output one voltage selected from the voltages V1 to V4.

The supply modulator 30 has the above configuration, so that the digital control signal corresponding to the envelope signal is input from the control terminal 135, and controls on/off of the plurality of switches S51 to S54 based on the digital control signal input from the control terminal 135 to select at least one of the plurality of voltages V1 to V4 generated by the switched-capacitor circuit 20. The supply modulator 30 outputs the selected voltage.

It should be appreciated that the waveform of the output voltage of the supply modulator 30 does not need to be a rectangular wave including only a plurality of discrete voltages. Specifically, the waveform of the output voltage of the supply modulator 30 becomes a waveform distorted from the rectangular wave by an overshoot voltage (e.g., a spike-shaped voltage) being generated when the voltage transitions from a discrete voltage having a relatively low voltage level to a discrete voltage having a relatively high voltage level. In addition, the waveform of the output voltage of the supply modulator 30 becomes a waveform distorted from the rectangular wave by an undershoot voltage (e.g., a spike-shaped voltage) being generated when the voltage transitions from the discrete voltage having a relatively high voltage level to the discrete voltage having a relatively low voltage level. The distortion of the waveform of the output voltage of the supply modulator 30 as described above causes noise. The amplitude of the spike-shaped voltage increases as the absolute value of a voltage change rate (dV/dt) increases.

(2.7) Band Select Switch Circuit

As illustrated in FIG. 6, the band select switch circuit 50 includes a common terminal 150, a plurality (four in the example of FIG. 6) of switches S81 to S84, and a plurality (four in the example of FIG. 6) of selection terminals 151 to 154, and a control terminal 155.

The common terminal 150 of the band select switch circuit 50 is connected to the output terminal 130 of the supply modulator 30. For example, a plurality of power amplifiers corresponding to communication bands that are different from each other are connected to the plurality of selection terminals 151 to 154, respectively. In the example illustrated in FIG. 6, the power amplifier 2 is connected to one selection terminal 151 among the plurality of selection terminals 151 to 154 through the filter circuit 40.

The control terminal 155 is an input terminal of a control signal Sg4. That is, the control terminal 155 is a terminal for receiving the control signal Sg4 indicating one of a plurality of communication bands. The band select switch circuit 50 controls on/off of the plurality of switches S81 to S84 such that the power amplifier corresponding to the communication band indicated by the control signal Sg4 is connected to the supply modulator 30.

The switch S81 is connected between the common terminal 150 and the selection terminal 151. Specifically, the switch S81 has a first terminal that is connected to the common terminal 150 and a second terminal that is connected to the selection terminal 151. In the above connection configuration, the switch S81 performs switching between the connection and the disconnection between the common terminal 150 and the selection terminal 151 by performing switching between on and off.

The switch S82 is connected between the common terminal 150 and the selection terminal 152. Specifically, the switch S82 has a first terminal that is connected to the common terminal 150 and a second terminal that is connected to the selection terminal 152. In the above connection configuration, the switch S82 performs switching between the connection and the disconnection between the common terminal 150 and the selection terminal 152 by performing switching between on and off.

The switch S83 is connected between the common terminal 150 and the selection terminal 153. Specifically, the switch S83 has a first terminal that is connected to the common terminal 150 and a second terminal that is connected to the selection terminal 153. In the above connection configuration, the switch S83 performs switching between the connection and the disconnection between the common terminal 150 and the selection terminal 153 by performing switching between on and off.

The switch S84 is connected between the common terminal 150 and the selection terminal 154. Specifically, the switch S84 has a first terminal that is connected to the common terminal 150 and a second terminal that is connected to the selection terminal 154. In the above connection configuration, the switch S84 performs switching between the connection and the disconnection between the common terminal 150 and the selection terminal 154 by performing switching between on and off.

In the example in FIG. 6, the plurality of switches S81 to S84 are controlled to be exclusively turned on. That is, only any one of the switches S81 to S84 is turned on, and the rest of the switches S81 to S84 are turned off.

(2.8) Filter Circuit

As illustrated in FIG. 6, the filter circuit 40 includes an input terminal 141, an output terminal 142, and a plurality of functional elements. The plurality of functional elements includes a plurality (three in the example of FIG. 6) of inductors L0, L1, and L2 and a plurality (two in the example of FIG. 6) of capacitors C1 and C2.

The input terminal 141 is configured as an input terminal of a voltage selected by the supply modulator 30. That is, the input terminal 141 is a terminal for receiving the voltage selected from the plurality of voltages V1 to V4 according to an exemplary aspect. In the example of FIG. 6, the input terminal 141 is connected to the output terminal 130 of the supply modulator 30 through the band select switch circuit 50.

The output terminal 142 is a terminal from which the voltage filtered by the filter circuit 40 is output. The voltage output from the output terminal 142 of the filter circuit 40 is the power supply voltage Vcc supplied to the power amplifier 2.

The inductor L0 is connected between the input terminal 141 and the output terminal 142. More specifically, one end (e.g., the first end) of the inductor L0 is connected to the input terminal 141, and the other end (e.g., the second end) of the inductor L0 is connected to the output terminal 142.

The inductor L1 and the capacitor C1 are connected in series between the one end of the inductor L0 and the ground. More specifically, one end (e.g., the first end) of the inductor L1 is connected to the one end (e.g., the first end) of the inductor L0, the other end (e.g., the second end) of the inductor L1 is connected to one of two electrodes of the capacitor C1, and the other of the two electrodes of the capacitor C1 is connected to the ground. That is, the filter circuit 40 includes a first LC series circuit 41 (see FIG. 2) including the inductor L1 (also referred to as a first inductor L1 below) and the capacitor C1 (also referred to as a first capacitor C1 below).

The inductor L2 and the capacitor C2 are connected in series between the other end of the inductor L0 and the ground. More specifically, one end (e.g., the first end) of the inductor L2 is connected to the other end (e.g., the second end) of the inductor L0, the other end (e.g., the second end) of the inductor L2 is connected to one of two electrodes of the capacitor C2, and the other of the two electrodes of the capacitor C2 is connected to the ground. That is, the filter circuit 40 includes a second LC series circuit 42 (see FIG. 2) including the inductor L2 (also referred to as a second inductor L2 below) and the capacitor C2 (also referred to as a second capacitor C2 below).

The filter circuit 40 configures a low pass filter. Thus, the filter circuit 40 can reduce a radio frequency component included in the power supply voltage Vcc. For example, when a predetermined band is a frequency band for Frequency Division Duplex (FDD), the filter circuit 40 is configured to reduce a component of a downlink operation band of the predetermined band.

The filter characteristic of the filter circuit 40 has two attenuation poles. The frequency of one of the two attenuation poles is determined by the circuit constant of each of the first inductor L1 and the first capacitor C1 in the first LC series circuit. The frequency of the other attenuation pole of the two attenuation poles is determined by the circuit constant of each of the second inductor L2 and the second capacitor C2 in the second LC series circuit.

The filter circuit 40 is configured to reduce the amplitude of a spike-shaped voltage of the output voltage output from the supply modulator 30. That is, the power supply circuit 1 includes the filter circuit 40, and thus reduces the waveform distortion of the output voltage output from the supply modulator 30. Thus, it is possible to reduce a radio frequency component of the output voltage. As a result, in the power supply circuit 1, it is possible to reduce noise included in the power supply voltage Vcc, and thus it is possible to reduce noise that enters the power amplifier 2 from the power supply circuit 1.

(2.9) Digital Control Circuit

Figure 7:
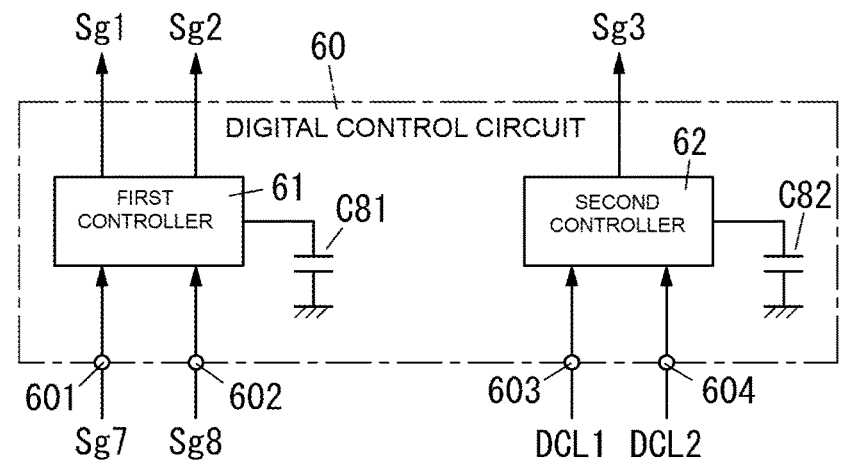
FIG. 7 is a circuit configuration diagram of a digital control circuit in the power supply circuit according to exemplary Embodiment 1.

As illustrated in FIG. 7, the digital control circuit 60 includes a first controller 61, a second controller 62, two capacitors C81 and C82, and four control terminals 601 to 604. The four control terminals 601 to 604 of the digital control circuit 60 are connected to the four second control terminals T5 (see FIG. 4) provided in the radio frequency system 200 in a one-to-one manner. Therefore, the four control terminals 601 to 604 of the digital control circuit 60 are connected to the RF signal processing circuit 51 (see FIG. 4) of the communication device 7.

The first controller 61 receives a source-synchronous digital control signal from the RF signal processing circuit 51 through the control terminals 601 and 602, and processes the digital control signal and generates the control signal Sg1 and the control signal Sg2.

In the first controller 61, one set of a clock signal Sg7 and a data signal Sg8 is used as the digital control signals for the pre-regulator circuit 10 and the switched-capacitor circuit 20. The clock signal Sg7 is input to the first controller 61 through the control terminal 601. The data signal Sg8 is input to the first controller 61 through the control terminal 602.

The second controller 62 is configured to process digitally controlled level (DCL) signals DCL1 and DCL2, which are digital control signals received from the RF signal processing circuit 51 through the control terminals 603 and 604, and generates the control signal Sg3. The digitally controlled level signals DCL1 and DCL2 correspond to envelope signals.

Each of the digitally controlled level signals DCL1 and DCL2 is a 1-bit signal. Each of the voltages V1 to V4 is represented by a combination of two 1-bit signals. For example, V1, V2, V3, and V4 are represented by "00", "01", "10", and "11", respectively. A Gray code may be used to express the voltage level. In the above case, two digitally controlled level signals are used to control the supply modulator 30, but the number of digitally controlled level signals is not limited to two. For example, any number of digitally controlled level signals, one or three or more, may be used in accordance with the number of voltage levels that can be selected by the supply modulator 30. The digital control signal used to control the supply modulator 30 is not limited to the digitally controlled level signal.

The capacitor C81 is connected between the first controller 61 and the ground. For example, the capacitor C81 is connected between a power line for supplying power to the first controller 61 and the ground, and functions as a bypass capacitor. The capacitor C82 is connected between the second controller 62 and the ground. For example, the capacitor C82 is connected between a power line for supplying power to the second controller 62 and the ground, and functions as a bypass capacitor.

(3) Structure of Tracker Module

As illustrated in FIGS. 1 to 3, the tracker module 100 according to Embodiment 1 includes the second board 9, the IC chip 80, the plurality (ten in the example of FIG. 6) of capacitors C11 to C16 and C21 to C24 of the switched-capacitor circuit 20, the plurality (four in FIG. 6) of capacitors C61 to C64 of the pre-regulator circuit 10, the inductors L0 to L2 and the capacitors C1 and C2 of the filter circuit 40, and the plurality of external connection terminals 160. The tracker module 100 according to Embodiment 1 further includes a resin layer 94 and a shield electrode layer 95. The tracker module 100 according to Embodiment 1 has a circuit configuration in which the power inductor L71 is removed from the circuit configuration of the power supply circuit 1. That is, the tracker module 100 does not include the power inductor L71. In FIG. 1, the resin layer 94 and the shield electrode layer 95 are not illustrated.

(3.1) Second Board

As illustrated in FIGS. 1 and 3, the second board 9 has a first main surface 91 and a second main surface 92 that face each other in the thickness direction D0 of the second board 9. For purposes of this disclosure, the term "facing" means facing geometrically rather than physically. The second board 9 has a recess in a plan view in the thickness direction D0 of the second board 9. The second board 9 has, for example, an L-shape in a plan view in the thickness direction D0 of the second board 9.

An outer edge 93 of the second board 9 in the tracker module 100 includes a first side 931, a second side 932, a third side 933, a fourth side 934, a fifth side 935, and a sixth side 936. The first side 931, the second side 932, the third side 933, the fourth side 934, the fifth side 935, and the sixth side 936 are arranged in an order of the first side 931, the second side 932, the third side 933, the sixth side 936, the fifth side 935, and the fourth side 934. The first side 931 and the third side 933 are parallel to each other, and the first side 931 is longer than the third side 933. The second side 932 and the fourth side 934 are parallel to each other, and the second side 932 is longer than the fourth side 934. The first side 931 and the fifth side 935 are parallel to each other. The second side 932 and the sixth side 936 are parallel to each other. The fifth side 935 and the sixth side 936 face the recess.

The second board 9 is, for example, a multilayer laminate in which a plurality of dielectric layers and a plurality of conductive layers (not illustrated) are laminated. A material of each conductive layer is, for example, copper. The plurality of conductive layers includes a ground layer. The ground layer of the second board 9 is electrically connected to at least one external ground terminal included in the plurality of external connection terminals 160 through a via conductor or the like of the second board 9.

The second board 9 is, for example, a low temperature co-fired ceramics (LTCC) board. The second board 9 is not limited to the LTCC board, and may be, for example, a printed wiring board, a high temperature co-fired ceramics (HTCC) board, a resin multilayer laminate, or a component-embedded board.

(3.2) IC Chip

As illustrated in FIGS. 1 to 3, the IC chip 80 is disposed at the second board 9. For purposes of this disclosure, the phase "the IC chip 80 is disposed at the second board 9" includes the meanings that the IC chip 80 is mechanically connected to the second board 9 and that the IC chip 80 is electrically connected to the second board 9. The IC chip 80 is disposed on the first main surface 91 of the second board 9. The IC chip 80 is, for example, a Si-based IC chip including a silicon substrate. The Si-based IC chip may include a silicon-on-insulator (SOI) substrate instead of a silicon substrate. The IC chip 80 is not limited to a Si-based IC chip, and may be, for example, a GaAs-based IC chip, a SiGe-based IC chip, or a GaN-based IC chip.

An outer edge 800 of the IC chip 80 has a rectangular shape in the plan view in the thickness direction D0 of the second board 9. The outer edge 800 of the IC chip 80 includes a first side 801, a second side 802, a third side 803, and a fourth side 804. The first side 801, the second side 802, the third side 803, and the fourth side 804 are arranged in the order of the first side 801, the second side 802, the third side 803, and the fourth side 804. At the outer edge 800, the first side 801 and the third side 803 are parallel to each other, and the second side 802 and the fourth side 804 are parallel to each other.

As illustrated in FIG. 1, the IC chip 80 includes a PR switch portion (first switch portion) 101, an SC switch portion (second switch portion) 102, an SM switch portion (third switch portion) 103, a BS switch portion (fourth switch portion) 104, a digital control unit 105, and a plurality of input and output electrodes 81.

The PR switch portion 101 includes a plurality of switches S61 to S63, S71, and S72 (see FIG. 6) of the pre-regulator circuit 10. In the IC chip 80, the PR switch portion 101 is disposed along the first side 801.

The SC switch portion 102 includes a plurality of switches S11, S12, S21, S22, S31, S32, S41, and S42 (see FIG. 6) of the switched-capacitor circuit 20. Specifically, the SC switch portion 102 includes a series circuit in which the plurality of switches S12, S11, S22, S21, S32, S31, S42, and S41 are connected in this order. The SC switch portion 102 includes a plurality of switches S13, S14, S23, S24, S33, S34, S43, and S44 (see FIG. 6) of the switched-capacitor circuit 20. Specifically, the SC switch portion 102 includes a series circuit in which the plurality of switches S14, S13, S24, S23, S34, S33, S44, and S43 are connected in this order. In the IC chip 80, the SC switch portion 102 is disposed along the second side 802.

The SM switch portion 103 includes a plurality of switches S51 to S54 (see FIG. 6) of the supply modulator 30. In the IC chip 80, the SC switch portion 102 is disposed to be adjacent to the SM switch portion 103.

The BS switch portion 104 includes a plurality of switches S81 to S84 (see FIG. 6) included in the band select switch circuit 50. In the IC chip 80, the BS switch portion 104 is disposed to be adjacent to the SM switch portion 103. According to an exemplary aspect, the BS switch portion 104 being disposed adjacent to the SM switch portion 103 means that the BS switch portion 104 and the SM switch portion 103 are disposed without none of the PR switch portion 101 and the SC switch portion 102 between the BS switch portion 104 and the SM switch portion 103, in the plan view of the IC chip 80. In the IC chip 80, the BS switch portion 104 is disposed along the fourth side 804.

The digital control unit 105 includes the first controller 61 and the second controller 62 (see FIG. 7) of the digital control circuit 60. The digital control unit 105 is disposed at the central portion of the IC chip 80 in the plan view in the thickness direction D0 of the second board 9, and is surrounded by the PR switch portion 101, the SC switch portion 102, the SM switch portion 103, and the BS switch portion 104.

In the IC chip 80, each of the plurality of switches S11 to S14, S21 to S24, S31 to S34, S41 to S44, S51 to S54, S61 to S63, S71, S72, and S81 to S84 is, for example, a metal oxide semiconductor field effect transistor (MOSFET).

(3.3) Plurality of Capacitors of Switched-Capacitor Circuit and Plurality of Capacitors of Pre-Regulator Circuit As illustrated in FIG. 1, a plurality (ten in the example of FIG. 6) of capacitors C11 to C16 and C21 to C24 of the switched-capacitor circuit 20 and a plurality (four in the example of FIG. 6) of capacitors C61 to C64 of the pre-regulator circuit 10 are disposed at the second board 9. More specifically, the plurality of capacitors C11 to C16 and C21 to C24, and the plurality of capacitors C61 to C64 are disposed on the first main surface 91 of the second board 9. Each of the plurality of capacitors C11 to C16, C21 to C24, and the plurality of capacitors C61 to C64 is a chip capacitor. That is, each of the plurality of capacitors C11 to C16, C21 to C24, and the plurality of capacitors C61 to C64 is a surface-mounted capacitor.

The capacitor connected between the input terminal 110 and the inductor connection terminal 115 in the pre-regulator circuit 10 is disposed in a PR capacitance portion 901 on the first main surface 91 of the second board 9. In the pre-regulator circuit 10, the capacitors C61 to C64 connected between the inductor connection terminal 116 and the output terminals 111 to 114 are disposed in a PR capacitance portion 902 of the first main surface 91 of the second board 9. That is, the plurality of capacitors C61 to C64 included in the pre-regulator circuit 10 are disposed along the second side 802 of the IC chip 80. More specifically, the plurality of capacitors C61 to C64 included in the pre-regulator circuit 10 are adjacent to the PR switch portion 101 included in the IC chip 80.

The plurality of capacitors C11 to C16 and C21 to C24 included in the switched-capacitor circuit 20 are disposed in an SC capacitance portion 903 on the first main surface 91 of the second board 9. That is, the plurality of capacitors C11 to C16 and C21 to C24 included in the switched-capacitor circuit 20 are disposed along the second side 802 of the IC chip 80. More specifically, the plurality of capacitors C11 to C16 and C21 to C24 included in the switched-capacitor circuit 20 are adjacent to the SC switch portion 102 included in the IC chip 80.

(3.4) Inductor and Capacitor of Filter Circuit

As illustrated in FIG. 1, the plurality (three in the example of FIG. 6) of inductors L0 to L2 and one or more (two in the example of FIG. 6) capacitors C1 and C2 included in the filter circuit 40 are disposed at the second board 9. More specifically, the plurality of inductors L0 to L2 and the one or more capacitors C1 and C2 are disposed on the first main surface 91 of the second board 9. Each of the plurality of inductors L0 to L2 is a chip inductor. That is, each of the plurality of inductors L0 to L2 is a surface-mounted inductor. Each of the one or more capacitors C1 and C2 is a chip capacitor. That is, each of the one or more capacitors C1 and C2 is a surface-mounted capacitor.

The plurality of inductors L0 to L2 and the one or more capacitors C1 and C2 included in the filter circuit 40 are disposed in a filter circuit portion 904 of the second board 9. That is, the plurality of inductors L0 to L2 and the one or more capacitors C1 and C2 included in the filter circuit 40 are disposed along the fourth side 804 of the IC chip. More specifically, the inductor L0 included in the filter circuit 40 is adjacent to the BS switch portion 104 of the IC chip.

(3.5) Input and Output Electrode

As illustrated in FIG. 3, the plurality of input and output electrodes 81 are electrically connected to circuit components other than the IC chip 80, which are disposed on the first main surface 91 of the second board 9, the plurality of external connection terminals 160 disposed on the second main surface 92 of the second board 9, or the like through wiring portions, via conductor portions, or the like formed at the second board 9.

(3.6) External Connection Terminal

The plurality of external connection terminals 160 illustrated in FIG. 3 include an input terminal 161 (see FIG. 4), a plurality (four) of input control terminals 165 (only one is illustrated in FIG. 4), an output terminal 164 (see FIG. 4), and a ground terminal (not illustrated). The input terminal 161 is connected to the input terminal 110 of the pre-regulator circuit 10. The input terminal 161 is a terminal connected to the DC power source 70 through the power source connection terminal T4 provided in the radio frequency system 200. That is, the input terminal 110 of the pre-regulator circuit 10 is connected to the DC power source 70 through the input terminal 161. The four input control terminals 165 are terminals connected to the four second control terminals T5. The four input control terminals 165 are connected to the control terminals 601 to 604 of the digital control circuit 60. The output terminal 164 is connected to the output terminal 142 of the filter circuit 40. The output terminal 164 is a terminal to which the power supply voltage Vcc is output, and is connected to the power supply terminal of the power amplifier 2. The plurality of ground terminals are terminals to which a ground potential is applied.

(3.7) Resin Layer

As illustrated in FIG. 3, a resin layer 94 is disposed on the first main surface 91 of the second board 9, and covers a portion of each of the plurality of circuit components included in the tracker module 100 and the first main surface 91 of the second board 9. The plurality of circuit components includes the IC chip 80, the plurality of capacitors C11 to C16, the plurality of capacitors C21 to C24, and the plurality of capacitors C61 to C64. The resin layer 94 contains resin (for example, epoxy resin). The resin layer 94 may contain a filler in addition to the resin. The resin layer 94 is electrically insulating.

(3.8) Shield Electrode Layer

As illustrated in FIG. 3, the shield electrode layer 95 covers the resin layer 94 and the second board 9. More specifically, the shield electrode layer 95 covers a main surface 941 and an outer peripheral surface 943 of the resin layer 94 and the outer edge 93 of the second board 9.

The shield electrode layer 95 has conductivity. In the tracker module 100, the shield electrode layer 95 is a shield layer provided for the purpose of electromagnetic shielding the inside and the outside of the tracker module 100. The shield electrode layer 95 is in contact with at least a portion of an outer peripheral surface of the ground layer provided in the second board 9. Therefore, it is possible to set the potential of the shield electrode layer 95 to be equal to the potential of the ground layer. Although the shield electrode layer 95 has a multilayer structure in which a plurality of metal layers are laminated, the shield electrode layer 95 is not limited to the multilayer structure, and may be one metal layer. The metal layer contains one type or a plurality of types of metals.

(4) Structure of Power Supply System

The power supply system 300 includes the first board 8 and a plurality of electronic components disposed at the first board 8. The first board 8 is, for example, a printed wiring board. The first board 8 has a third main surface 82 and a fourth main surface 83 that face each other in a thickness direction of the first board 8. The plurality of electronic components includes the tracker module 100 and the power inductor L71.

The tracker module 100 is disposed on the third main surface 82 of the first board 8. According to an exemplary aspect, the thickness direction of the first board 8 is parallel to the thickness direction D0 of the second board 9 of the tracker module 100. The thickness direction of the first board 8 is referred to as the thickness direction D0 of the first board 8 below. The tracker module 100 is connected to the power inductor L71 through the first board 8. More specifically, the inductor connection terminal 115 of the tracker module 100 is connected to one end (e.g., the first end) of the power inductor L71, and the inductor connection terminal 116 of the tracker module 100 is connected to the other end (e.g., the second end) of the power inductor L71.

The tracker module 100 and the power inductor L71 are disposed inside a rectangular region A01 in the plan view in the thickness direction D0 of the first board 8. The region A01 corresponds to a first region.

More specifically, the region A01 includes a rectangular region A03 and a region A02. The tracker module 100 is located in a region A02 that is a portion of the region A01 in the plan view in the thickness direction D0 of the first board 8. The fifth side 935 and the sixth side 936 of the second board 9 of the tracker module 100 face the region A03 that is a portion of the region A01. In other words, in the plan view in the thickness direction D0 of the first board 8, the second board 9 has a recess, and the recess is the region A03.

The power inductor L71 is located in the rectangular region A03 that is the portion of the region A01, in a plan view in the thickness direction D0 of the first board 8. The region A03 corresponds to a second region. That is, the power inductor L71 is disposed in the recess of the second board 9 in a plan view in the thickness direction D0 of the first board 8. According to an exemplary aspect, the region A03 is in contact with one side of the rectangular region A01. The rectangular region A03 includes one of four vertices of the rectangular region A01. The region A02 includes all portions of the rectangular region A01, which are not included in the rectangular region A01.

In the plan view in the thickness direction D0 of the first board 8, the tracker module 100 and the power inductor L71 face each other in a direction D1 perpendicular to the thickness direction D0 of the second board 9. For purposes of this disclosure, the phrase that "the tracker module 100 and the power inductor L71 face each other in the direction D1" means that the tracker module 100 and the power inductor L71 face each other geometrically rather than physically. More specifically, the fifth side 935 of the second board 9 in the tracker module 100 faces the power inductor L71 in the direction D1.

The tracker module 100 and the power inductor L71 face each other in the direction D2, in the plan view in the thickness direction D0 of the first board 8. A direction D2 is perpendicular to the thickness direction D0 of the first board 8 and perpendicular to the direction D1. More specifically, the sixth side 936 of the second board 9 in the tracker module 100 faces the power inductor L71 in the direction D2. At the outer edge 93 of the second board 9 of the tracker module 100, a portion (fifth side 935) that faces the power inductor L71 in the direction D1 and a portion (sixth side 936) that faces the power inductor L71 in the direction D2 do not include the same portion and are not parallel to each other. At the outer edge 93 of the second board 9 of the tracker module 100, the fifth side 935 and the sixth side 936 face the recess of the second board 9.

(5) Structure of Radio Frequency System

The radio frequency system 200 includes the power supply system 300, the power amplifier 2, and the filter 3. The power amplifier 2 and the filter 3 are disposed at, for example, the first board 8 which is the motherboard of the communication device 7. The communication device 7 may include a motherboard different from the first board 8, and the radio frequency system 200 includes the power supply system 300, and the power amplifier 2 and the filter 3 disposed at this motherboard.

(6) Structure of Communication Device

The communication device 7 includes the radio frequency system 200, the signal processing circuit 5 connected to the radio frequency system 200, and an antenna 6. The signal processing circuit 5 is disposed at, for example, the first board 8 which is the motherboard of the communication device 7. The communication device 7 may include a motherboard different from the first board 8, and the communication device 7 includes the power supply system 300, and the power amplifier 2, the filter 3, and the signal processing circuit 5 disposed at the motherboard, and the antenna 6.

(7) Effects

The power supply system 300 according to Embodiment 1 includes the first board 8, the tracker module 100, and the power inductor L71. The tracker module 100 is disposed at the first board 8. The power inductor L71 is disposed at the first board 8. The tracker module 100 includes the second board 9 and one IC chip 80. The one IC chip 80 is disposed at the second board 9. The one IC chip includes the switches S61 to S63, S71, and S72 included in the pre-regulator circuit 10, switches S11 to S44 included in the switched-capacitor circuit 20, and switches S51 to S54 included in the supply modulator 30.

The pre-regulator circuit 10 is configured to convert an input voltage into an adjustment voltage by using the power inductor L71. The switched-capacitor circuit 20 is configured to generate a plurality of discrete voltages based on the adjustment voltage. The supply modulator 30 is configured to selectively output at least one of the plurality of discrete voltages to the power amplifier 2. In the plan view in the thickness direction D0 of the first board 8, the second board 9 has the recess A03, and the power inductor L71 is disposed in the recess A03. As a result, the size of the power supply system 300 including the power inductor L71 and the tracker module 100 can be reduced.

In the power supply system 300 according to Embodiment 1, in the plan view in the thickness direction D0 of the first board 8, the tracker module 100 and the power inductor L71 face each other in the direction D1 and face each other in the direction D2. The direction D1 is perpendicular to the thickness direction D0 of the first board 8. The direction D2 is perpendicular to the thickness direction D0 and the direction D1 of the first board 8.

As a result, in the power supply system 300, an unnecessary space is less likely to occur between the tracker module 100 and the power inductor L71. Thus, the size of the power supply system 300 including the power inductor L71 and the tracker module 100 can be reduced.

In the power supply system 300 according to Embodiment 1, the tracker module 100 and the power inductor L71 are located inside the rectangular region A01 in the plan view in the thickness direction D0 of the first board 8. As a result, in the power supply system 300, the tracker module 100 and the power inductor L71 can be regarded as one rectangular device, so that it is possible to further reduce the size of the power supply system 300.

In the power supply system 300 according to Embodiment 1, the power inductor L71 is located inside the region A03 that is the portion of the region A01 in the plan view in the thickness direction D0 of the first board 8. The region A03 is in contact with one side of the region A01. As a result, it is possible to make the shape of the tracker module 100 be a simple shape in the plan view in the thickness direction D0 of the first board 8. Since a portion of the outer peripheral surface of the power inductor L71 does not face the tracker module 100, it is possible to secure heat dissipation properties of the power inductor L71.

In the power supply system 300 according to Embodiment 1, the region A03 includes one of the four vertices of the first region of the rectangular region A01. As a result, it is possible to make the shape of the tracker module 100 be a simple shape such as an L-shape in the plan view in the thickness direction D0 of the first board 8.

The tracker module 100 according to Embodiment 1 has the fifth side 935 facing the power inductor L71 in the direction D1 and the sixth side 936 facing the power inductor L71 in the direction D2. The direction D1 is perpendicular to the thickness direction D0 of the second board 9. The direction D2 is perpendicular to the thickness direction D0 and the direction D1 of the second board 9. As a result, in the power supply system 300 including the tracker module 100 and the power inductor L71, the positional relationship between the tracker module 100 and the power inductor L71 is limited. Thus, in the power supply system 300, an unnecessary space is less likely to occur between the tracker module 100 and the power inductor L71. Therefore, the size of the power supply system 300 including the power inductor L71 and the tracker module 100 can be reduced.

Exemplary Embodiment 2

Figure 8:
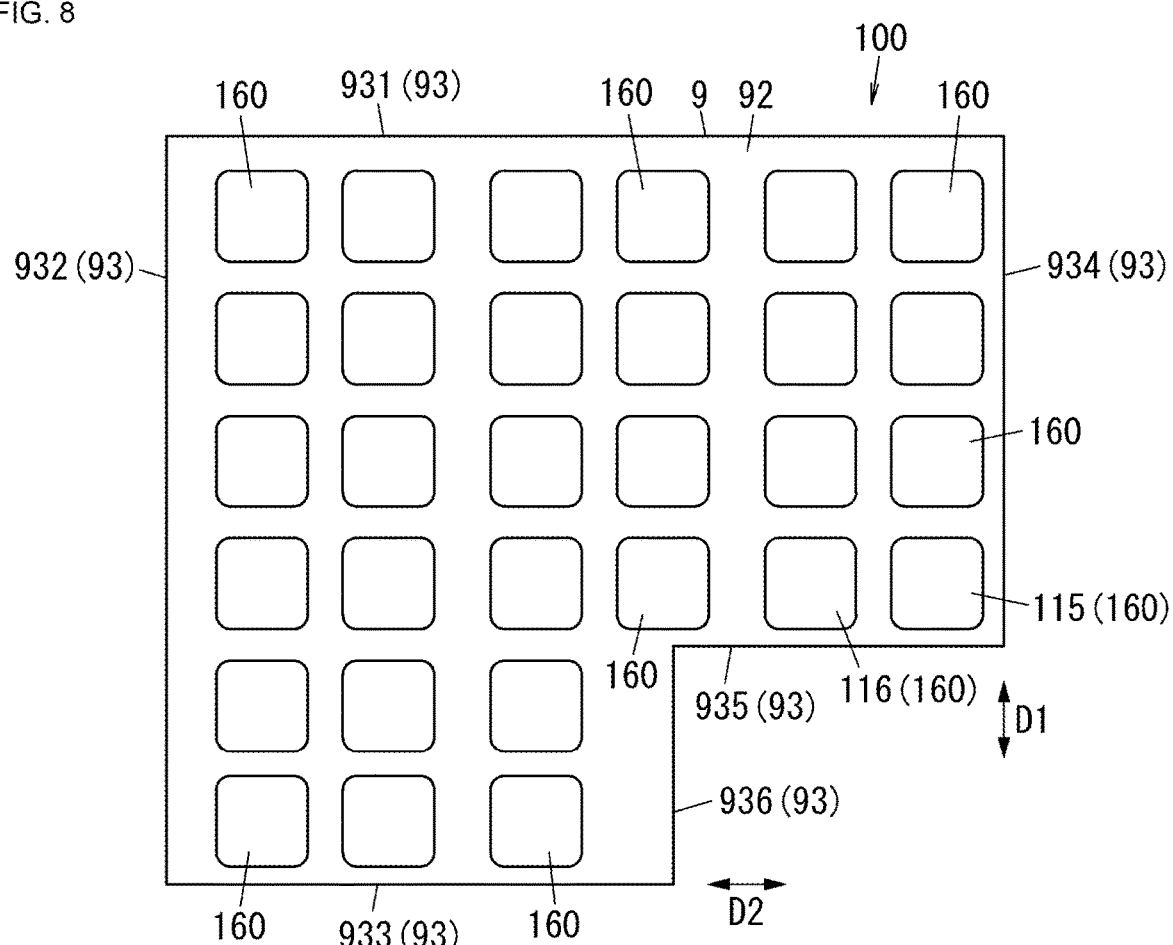
FIG. 8 is a rear view of a tracker module according to exemplary Embodiment 2.

In a power supply system 300 and a tracker module 100 according to Embodiment 2, an external connection terminal 160 has a disposition described below as illustrated in FIG. 8.

(1) Configuration

In the tracker module 100 according to Embodiment 2, as illustrated in FIG. 8, the external connection terminal 160 includes a plurality (two in the example of FIG. 8) of inductor connection terminals 115 and 116. The external connection terminal 160 is disposed on a second main surface 92 of a second board 9.

In the tracker module 100 according to Embodiment 2, inductor connection terminals 115 and 116 are adjacent to a fifth side 935 in an outer edge 93 of the second board 9. That is, the inductor connection terminals 115 and 116 are adjacent to a portion of the outer edge 93 of the second board 9, which faces a power inductor L71. For purposes of this disclosure, the phrase that "the inductor connection terminal 115 is adjacent to the fifth side 935" means that the external connection terminal 160 is not disposed between the inductor connection terminal 115 and the fifth side 935 on the second main surface 92 of the second board 9. Similarly, the phrase that "the inductor connection terminal 116 is adjacent to the fifth side 935" means that the external connection terminal 160 is not disposed between the inductor connection terminal 116 and the fifth side 935 on the second main surface 92 of the second board 9.

(2) Effects

In a power supply system 300 according to Embodiment 2, the inductor connection terminals 115 and 116 are adjacent to the fifth side 935 that faces the power inductor L71 in a direction D1 in the outer edge 93 of the second board 9. Thus, in a pre-regulator circuit 10, it is possible to shorten both a wiring length between the inductor connection terminal 115 and the power inductor L71 and a wiring length between the inductor connection terminal 116 and the power inductor L71. Therefore, the noise resistance performance of the pre-regulator circuit 10 is improved.

In the power supply system 300 according to Embodiment 2, the inductor connection terminals 115 and 116 are connected to switches S61 to S63, S71, and S72 included in the pre-regulator circuit 10. Thus, the wiring length of the pre-regulator circuit 10 can be shortened, and the noise resistance performance of the pre-regulator circuit 10 is further improved.

In the power supply system 300 according to Embodiment 2, the tracker module 100 includes the inductor connection terminals 115 and 116 that are connected to the power inductor L71. The inductor connection terminals 115 and 116 are adjacent to the fifth side 935 facing the power inductor L71 in the direction D1. As a result, in the pre-regulator circuit 10, it is possible to shorten both the wiring length between the inductor connection terminal 115 and the power inductor L71 and the wiring length between the inductor connection terminal 116 and the power inductor L71. Therefore, the noise resistance performance of the pre-regulator circuit 10 is improved.

In the power supply system 300 according to Embodiment 2, the inductor connection terminals 115 and 116 are connected to the switches S61 to S63, S71, and S72 included in the pre-regulator circuit 10, whereby the noise resistance performance of the pre-regulator circuit 10 is further improved.

Exemplary Embodiment 3

(1) Configuration

Figure 9:
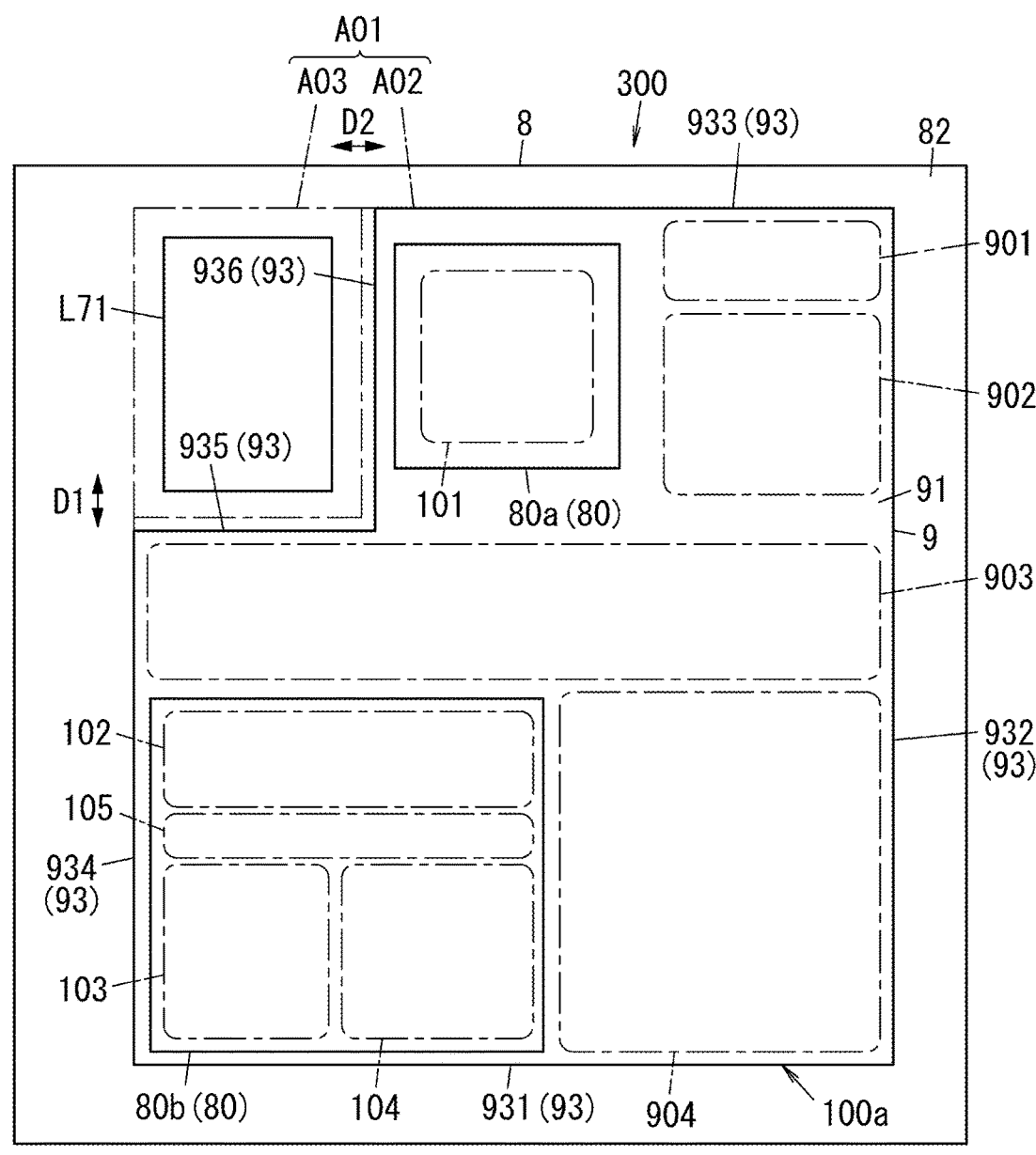
FIG. 9 is a plan view of a power supply system according to exemplary Embodiment 3.

In a power supply system 300 and a tracker module 100a according to Embodiment 3, the shape and structure of the tracker module 100a are as follows as illustrated in FIG. 9.

As illustrated in FIG. 9, the tracker module 100a according to Embodiment 3 includes two IC chips 80. The two IC chips 80 include IC chips 80a and 80b.

In the two IC chips 80, as illustrated in FIG. 9, the IC chip 80a is disposed on a first main surface 91 of a second board 9. The IC chip 80a includes a PR switch portion 101. That is, the IC chip 80a includes switches S61 to S63, S71, and S72 (see FIG. 6) included in a pre-regulator circuit 10 (see FIG. 6).

In the two IC chips 80, as illustrated in FIG. 9, the IC chip 80b is disposed on the first main surface 91 of the second board 9. The IC chip 80b includes an SC switch portion 102, an SM switch portion 103, a BS switch portion 104, and a digital control unit 105. That is, the IC chip 80b includes switches S11 to S44 (see FIG. 6) included in a switched-capacitor circuit 20 (see FIG. 6) and switches S51 to S54 (see FIG. 6) included in a supply modulator 30 (see FIG. 6).

Thus, the two IC chips 80 (80a and 80b) include the switches S61 to S63, S71, and S72 included in the pre-regulator circuit 10, the switches S11 to S44 included in the switched-capacitor circuit 20, and the switches S51 to S54 included in the supply modulator 30.

(2) Effects

In the tracker module 100a according to Embodiment 3, in the plan view in a thickness direction D0 of the second board 9, the IC chip 80a is adjacent to the fifth side 935 that faces a power inductor L71 in a direction D1 in an outer edge 93 of the second board 9. A PR capacitance portion 901 is adjacent to the IC chip 80a in the plan view in the thickness direction D0 of the second board 9. A PR capacitance portion 902 is adjacent to the IC chip 80a in the plan view in the thickness direction D0 of the second board 9. That is, in the tracker module 100*a* according to Embodiment 3, the PR switch portion 101 of the IC chip 80*a* is adjacent to both the power inductor L71 and either of the PR capacitance portions 901 and 902 in the plan view in the thickness direction D0 of the second board 9. As a result, in the tracker module 100*a* according to Embodiment 3, a wiring length of the pre-regulator circuit 10 can be shortened by disposing functional elements included in the pre-regulator circuit 10 to be close to each other.

In the tracker module 100*a* according to Embodiment 3, the IC chip 80*b* is adjacent to an SC capacitance portion 903 in the plan view in the thickness direction D0 of the second board 9. The SC switch portion 102 is adjacent to the SC capacitance portion 903. The SC capacitance portion 903 is located between the IC chip 80*a* and the IC chip 80*b*. As a result, in the tracker module 100*a* according to Embodiment 3, it is possible to shorten the wiring lengths of the pre-regulator circuit 10 and the switched-capacitor circuit 20, and to obtain the efficient wiring. More specifically, since the IC chip 80*a* and the SC capacitance portion 903 are adjacent to each other, it is possible to shorten the wiring length between the pre-regulator circuit 10 and nodes N1 to N4 of the switched-capacitor circuit 20 (see FIG. 6). Since the SC capacitance portion 903 and the IC chip 80*b* including the SC switch portion 102 are adjacent to each other, it is possible to shorten the wiring length in the switched-capacitor circuit 20.

In the tracker module 100*a* according to Embodiment 3, a filter circuit portion 904 is adjacent to the IC chip 80*b* in the plan view in the thickness direction D0 of the second board 9. In the IC chip 80*b*, the BS switch portion 104 is adjacent to the filter circuit portion 904. In the IC chip 80*b*, the SM switch portion 103 is adjacent to the SC switch portion 102 and adjacent to the BS switch portion 104.

In the power supply system 300 according to Embodiment 3, the tracker module 100*a* includes the two IC chips 80*a* and 80*b*. Each of the switches S61 to S63, S71, and S72 included in the pre-regulator circuit 10, the switches S11 to S44 included in the switched-capacitor circuit 20, and the switches S51 to S53 included in the supply modulator 30 is included in at least one of the IC chips 80*a* and 80*b*. In this case, similarly to Embodiment 1, in the power supply system 300, the positional relationship between the tracker module 100*a* and the power inductor L71 is limited. Thus, in the power supply system 300, an unnecessary space is less likely to occur between the tracker module 100*a* and the power inductor L71. Therefore, the size of the power supply system 300 including the power inductor L71 and the tracker module 100*a* can be reduced.

Exemplary Embodiment 4

(1) Configuration

Figure 10:
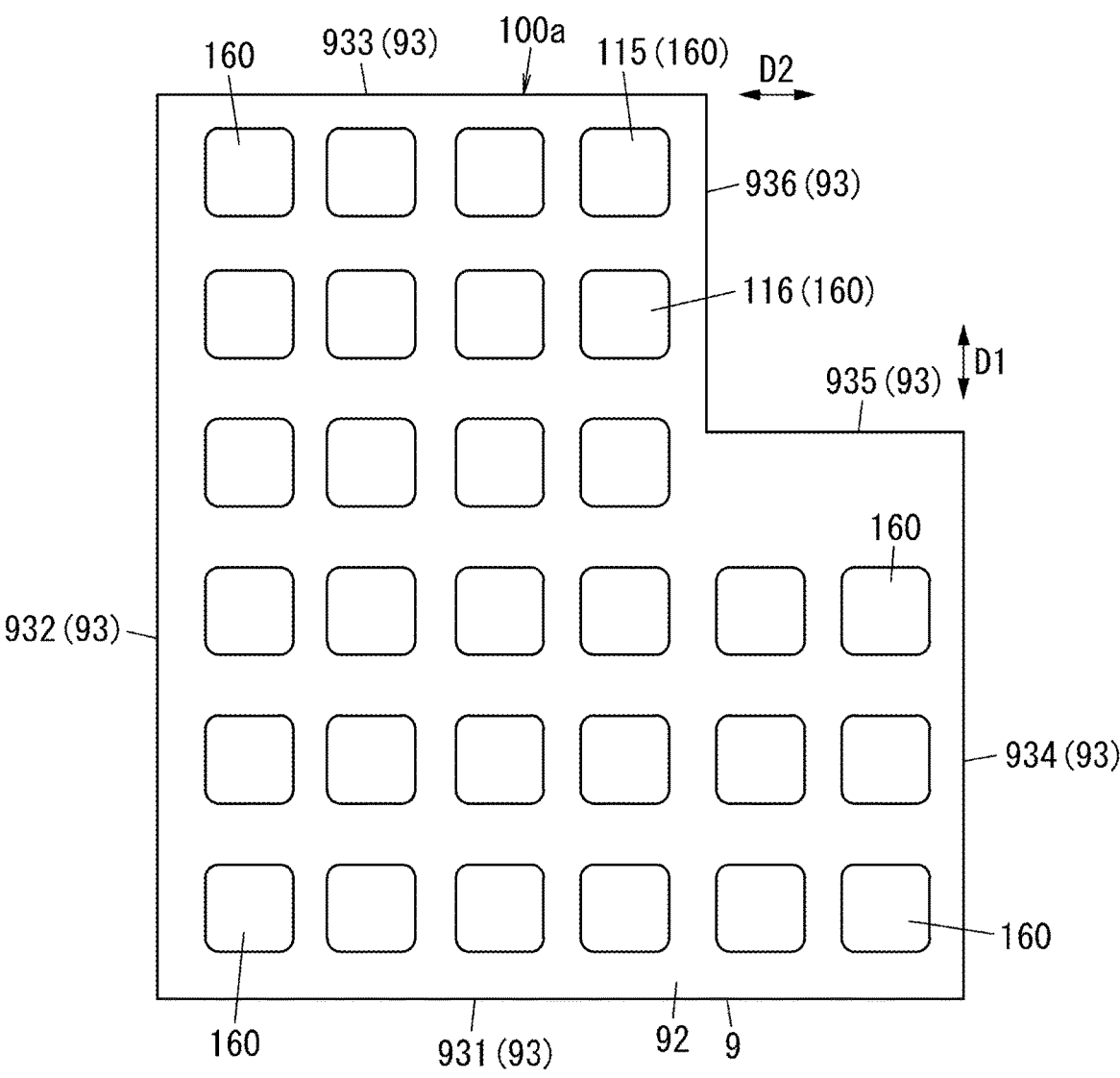
FIG. 10 is a rear view of a tracker module according to exemplary Embodiment 4.

In a power supply system 300 and a tracker module 100*a* according to Embodiment 4, the external connection terminal 160 has a disposition described below as illustrated in FIG. 10, in the tracker module 100*a* in Embodiment 3.

In the tracker module 100*a* according to Embodiment 4, the external connection terminal 160 includes the plurality (two in FIG. 10) of inductor connection terminals 115 and 116. As illustrated in FIG. 10, the external connection terminal 160 is disposed on the second main surface 92 of the second board 9.

In the tracker module 100*a* according to Embodiment 4, the plurality (two in FIG. 10) of inductor connection terminals 115 and 116 are adjacent to the sixth side 936 of the second board 9. Thus, in a pre-regulator circuit 10 (see FIG. 6), it is possible to shorten both a wiring length between the inductor connection terminal 115 and the power inductor L71 and a wiring length between the inductor connection terminal 116 and the power inductor L71.

In the tracker module 100*a* according to Embodiment 4, as illustrated in FIG. 9, the IC chip 80*a* is adjacent to the sixth side 936 of the second board 9. In the tracker module 100*a* according to Embodiment 4, as illustrated in FIG. 9, the PR switch portion 101 is adjacent to the sixth side 936 of the second board 9. That is, switches S61 to S63, S71, and S72 (see FIG. 6) included in the pre-regulator circuit 10 are adjacent to the sixth side 936 of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

(2) Effects

In the power supply system 300 according to Embodiment 4, the tracker module 100*a* includes the inductor connection terminals 115 and 116 that are connected to the power inductor L71. The inductor connection terminals 115 and 116 are adjacent to the sixth side 936 that faces the power inductor L71 in an outer edge 93 of the second board 9. As a result, in the pre-regulator circuit 10, it is possible to shorten both the wiring length between the inductor connection terminal 115 and the power inductor L71 and the wiring length between the inductor connection terminal 116 and the power inductor L71. Therefore, the noise resistance performance of the pre-regulator circuit 10 is improved.

In the power supply system 300 according to Embodiment 4, the inductor connection terminals 115 and 116 are connected to the switches S61 to S63, S71, and S72 included in the pre-regulator circuit 10, whereby the noise resistance performance of the pre-regulator circuit 10 is further improved.

In the power supply system 300 according to Embodiment 4, one IC chip 80*a* is adjacent to the sixth side 936 that faces the power inductor L71 in the outer edge 93 of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

In the power supply system 300 according to Embodiment 4, the inductor connection terminals 115 and 116 are connected to the switches S61 to S63, S71, and S72 included in the pre-regulator circuit 10. As a result, the noise resistance performance of the pre-regulator circuit 10 is further improved.

Exemplary Embodiment 5

(1) Configuration

Figure 11:
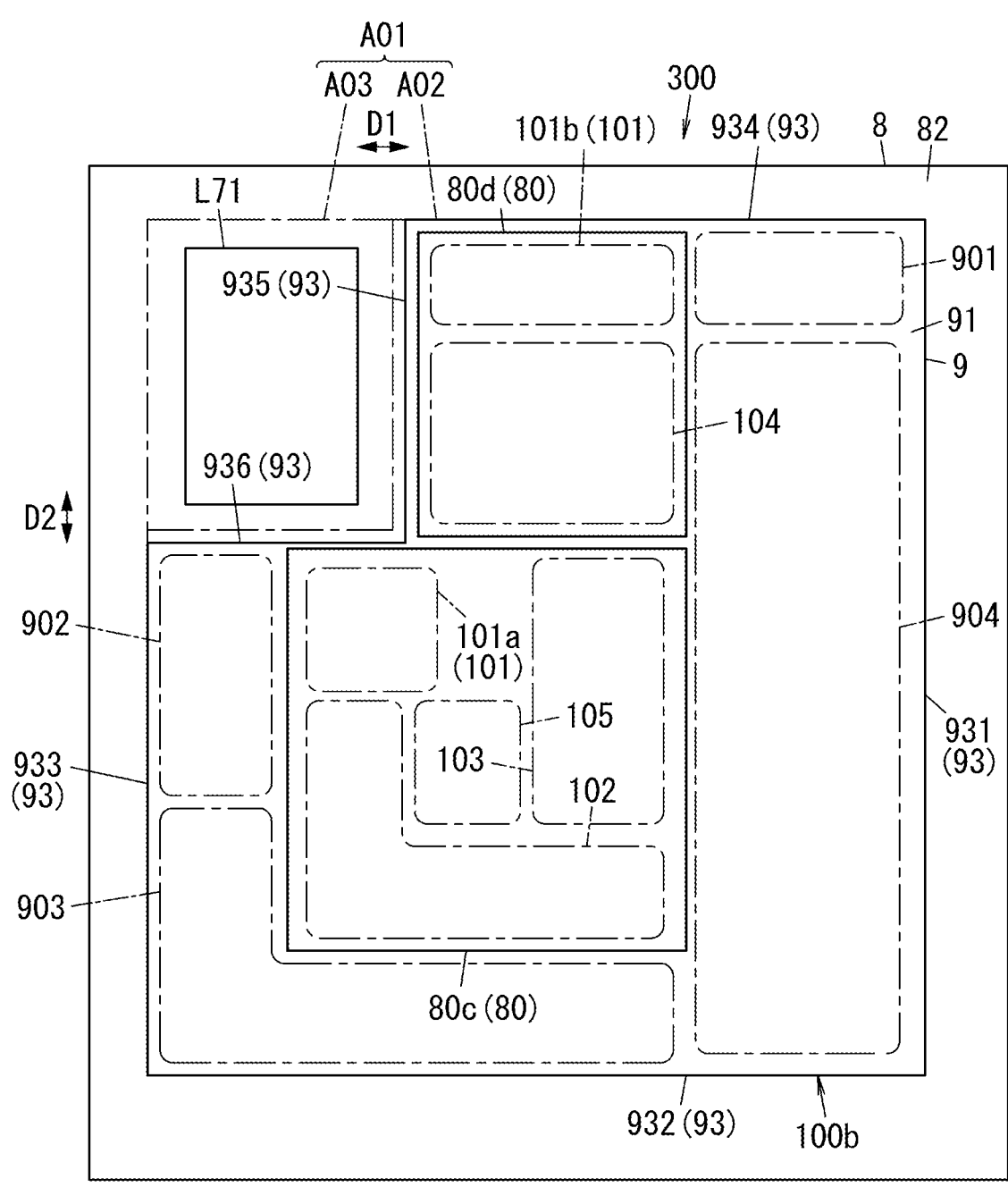
FIG. 11 is a plan view of a power supply system according to exemplary Embodiment 5.

In a power supply system 300 and a tracker module 100*b* according to Embodiment 5, the shape and structure of the tracker module 100*b* are as follows as illustrated in FIG. 11.

As illustrated in FIG. 11, the tracker module 100*b* according to Embodiment 5 includes two IC chips 80. The two IC chips include IC chips 80*c* and 80*d*.

The IC chip 80*c* of the two IC chips 80 is disposed on a first main surface 91 of a second board 9. As illustrated in FIG. 11, the IC chip 80*c* includes a PR switch portion 101*a*, an SC switch portion 102, an SM switch portion 103, a BS switch portion 104, and a digital control unit 105. That is, the IC chip 80*c* includes switches S61 to S63, S71, and S72 (see FIG. 6) included in a pre-regulator circuit 10 (see FIG. 6), and switches S11 to S44 (see FIG. 6) included in a switched-capacitor circuit 20 (see FIG. 6), and switches S51 to S54 (see FIG. 6) included in a supply modulator 30 (see FIG. 6).

The IC chip 80*d* is disposed on the first main surface 91 of the second board 9. As illustrated in FIG. 11, the IC chip 80*d* includes a PR switch portion 101*b*. That is, the IC chip 80*d* includes the switches S61 to S63, S71, and S72 included in the pre-regulator circuit 10.

Thus, the two IC chips 80 (80*c* and 80*d*) include the switches S61 to S63, S71, and S72 included in the pre-regulator circuit 10, the switches S11 to S44 included in the switched-capacitor circuit 20, and the switches S51 to S54 included in the supply modulator 30.

The PR switch portion 101*a* of the IC chip 80*c* includes some of the plurality of switches S61 to S63, S71, and S72 (see FIG. 6) of the pre-regulator circuit 10. The PR switch portion 101*b* of the IC chip 80*c* includes switches that are not included in the PR switch portion 101*a* among the plurality of switches S61 to S63, S71, and S72 (see FIG. 6) of the pre-regulator circuit 10. Specifically, the PR switch portion 101*a* of the IC chip 80*c* includes the plurality of switches S61 to S63 of the pre-regulator circuit 10. The PR switch portion 101*b* of the IC chip 80*d* includes the switches S71 and S72.

The capacitors C61 to C64 (see FIG. 6) connected between an inductor connection terminal 116 and output terminals 111 to 114 in the pre-regulator circuit 10 are disposed in a PR capacitance portion 902 of the first main surface 91 of the second board 9.

In the tracker module 100*b* according to Embodiment 5, in the plan view in a thickness direction D0 of the second board 9, the IC chip 80*d* is adjacent to a fifth side 935 that faces a power inductor L71 in a direction D1 in an outer edge 93 of the second board 9. More specifically, the PR switch portion 101*b* is adjacent to the fifth side 935 in the plan view in the thickness direction D0 of the second board 9. A PR capacitance portion 901 is adjacent to the IC chip 80*d* in the plan view in the thickness direction D0 of the second board 9. The IC chip 80*c* and the IC chip 80*d* are adjacent to each other in the plan view in the thickness direction D0 of the second board 9. As a result, in the tracker module 100*b* according to Embodiment 5, it is possible to shorten the wiring length of the pre-regulator circuit 10.

In the tracker module 100*b* according to Embodiment 5, in the plan view in the thickness direction D0 of the second board 9, the IC chip 80*c* is adjacent to a sixth side 936 that faces the power inductor L71 in the direction D2 in the outer edge 93 of the second board 9. More specifically, the PR switch portion 101*a* is adjacent to the sixth side 936 in the plan view in the thickness direction D0 of the second board 9. The PR capacitance portion 902 is adjacent to the IC chip 80*c* in the plan view in the thickness direction D0 of the second board 9. More specifically, the PR capacitance portion 902 is adjacent to the PR switch portion 101*a* of the IC chip 80*c* in the plan view in the thickness direction D0 of the second board 9. As a result, in the tracker module 100*b* according to Embodiment 5, it is possible to shorten the wiring length of the pre-regulator circuit 10.

In the IC chip 80*c*, the SC switch portion 102 is adjacent to the PR switch portion 101*a*. The SC capacitance portion 903 is adjacent to the SC switch portion 102 of the IC chip 80*c* in the plan view in the thickness direction D0 of the second board 9. As a result, in the tracker module 100*b* according to Embodiment 5, the wiring length of the switched-capacitor circuit 20 can be shortened.

In the IC chip 80*c*, the SM switch portion 103 is adjacent to the SC switch portion 102. The BS switch portion 104 of the IC chip 80*d* is adjacent to the SM switch portion 103 of the IC chip 80*c* in the plan view in the thickness direction D0 of the second board 9. A filter circuit portion 904 is adjacent to the BS switch portion 104 of the IC chip 80*d* in the plan view in the thickness direction D0 of the second board 9.

(2) Effects

In the power supply system 300 according to Embodiment 5, the tracker module 100*b* includes the two IC chips 80*c* and 80*d*. Each of the switches S61 to S63, S71, and S72 included in the pre-regulator circuit 10, the switches S11 to S44 included in the switched-capacitor circuit 20, and the switches S51 to S53 included in the supply modulator 30 is included in at least one of the IC chips 80*c* and 80*d*. In this case, similarly to Embodiment 1, in the power supply system 300, the positional relationship between the tracker module 100*b* and the power inductor L71 is limited. Thus, in the power supply system 300, an unnecessary space is less likely to occur between the tracker module 100*b* and the power inductor L71. Therefore, the size of the power supply system 300 including the power inductor L71 and the tracker module 100*b* can be reduced.

Exemplary Embodiment 6

(1) Configuration

Figure 12:
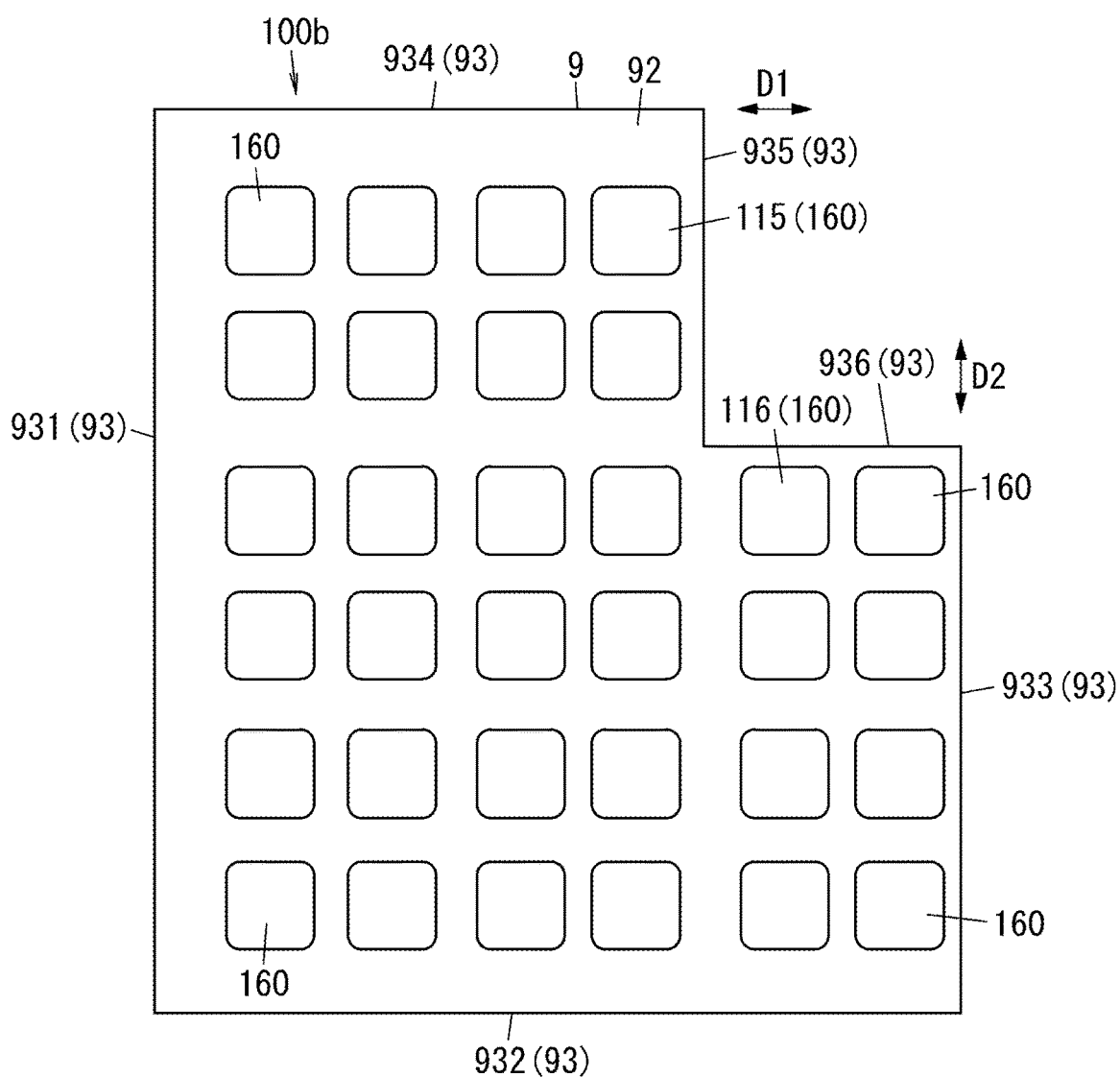
FIG. 12 is a rear view of a tracker module according to exemplary Embodiment 6.

In a power supply system 300 and a tracker module 100*b* according to Embodiment 6, the external connection terminal 160 has a disposition described below as illustrated in FIG. 12, in the tracker module 100*b* in Embodiment 5.

In the tracker module 100*b* according to Embodiment 6, the external connection terminal 160 includes the plurality (two in FIG. 12) of inductor connection terminals 115 and 116. As illustrated in FIG. 12, the external connection terminal 160 is disposed on the second main surface 92 of the second board 9.

In the tracker module 100*b* according to Embodiment 6, the inductor connection terminal 115 is adjacent to the sixth side 936 that faces the power inductor L71 in the outer edge 93 of the second board 9. In the tracker module 100*b* according to Embodiment 6, the inductor connection terminal 116 is adjacent to the fifth side 935 that faces the power inductor L71 in the outer edge 93 of the second board 9. Thus, in a pre-regulator circuit 10, it is possible to shorten both a wiring length between the inductor connection terminal 115 and the power inductor L71 and a wiring length between the inductor connection terminal 116 and the power inductor L71. Therefore, the noise resistance performance of the pre-regulator circuit 10 is improved.

In the tracker module 100*b* according to Embodiment 6, as illustrated in FIG. 11, the IC chip 80*c* is adjacent to the sixth side 936 that faces the power inductor L71 in the outer edge 93 of the second board 9. In the tracker module 100*b* according to Embodiment 6, as illustrated in FIG. 11, the PR switch portion 101*a* is adjacent to the sixth side 936 that faces the power inductor L71 in the outer edge 93 of the second board 9. That is, the switches S61 to S63 included in the pre-regulator circuit 10 are adjacent to the sixth side 936 that faces the power inductor L71 in the outer edge 93 of the second board 9. Thus, in the pre-regulator circuit 10, it is possible to further shorten the wiring length between the inductor connection terminal 115 and the power inductor L71 and the wiring length between the Inductor connection terminal 116 and the power inductor L71.

In the tracker module 100*b* according to Embodiment 6, as illustrated in FIG. 11, the IC chip 80*d* is adjacent to the fifth side 935 that faces the power inductor L71 in the outer edge 93 of the second board 9. In the tracker module 100*b* according to Embodiment 6, as illustrated in FIG. 11, the PR switch portion 101*b* is adjacent to the fifth side 935 that faces the power inductor L71 in the outer edge 93 of the second board 9. That is, the switches S71 and S72 included in the pre-regulator circuit 10 are adjacent to the fifth side 935 that faces the power inductor L71 in the outer edge 93 of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

(2) Effects

In the power supply system 300 according to Embodiment 6, the tracker module 100*b* includes the inductor connection terminals 115 and 116 that are connected to the power inductor L71. The inductor connection terminal 115 is adjacent to the sixth side 936 that faces the power inductor L71 in an outer edge 93 of the second board 9. The inductor connection terminal 116 is adjacent to the fifth side 935 that faces the power inductor L71 in an outer edge 93 of the second board 9. As a result, in the pre-regulator circuit 10, it is possible to shorten both the wiring length between the inductor connection terminal 115 and the power inductor L71 and the wiring length between the inductor connection terminal 116 and the power inductor L71. Therefore, the noise resistance performance of the pre-regulator circuit 10 is improved.

In the power supply system 300 according to Embodiment 6, the inductor connection terminals 115 and 116 are connected to the switches S61 to S63, S71, and S72 included in the pre-regulator circuit 10, whereby the noise resistance performance of the pre-regulator circuit 10 is further improved.

In the power supply system 300 according to Embodiment 6, the IC chip 80*c* is adjacent to the sixth side 936 that faces the power inductor L71 in the outer edge 93 of the second board 9. In the power supply system 300 according to Embodiment 6, the IC chip 80*d* is adjacent to the fifth side 935 that faces the power inductor L71 in the outer edge 93 of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

In the power supply system 300 according to Embodiment 6, the switches S61 to S63 included in the pre-regulator circuit 10 are adjacent to the sixth side 936 that faces the power inductor L71 in the outer edge 93 of the second board 9. Further, in the power supply system 300 according to Embodiment 6, the switches S71 and S72 included in the pre-regulator circuit 10 are adjacent to the fifth side 935 that faces the power inductor L71 in the outer edge 93 of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

Exemplary Embodiment 7

(1) Configuration

Figure 13:
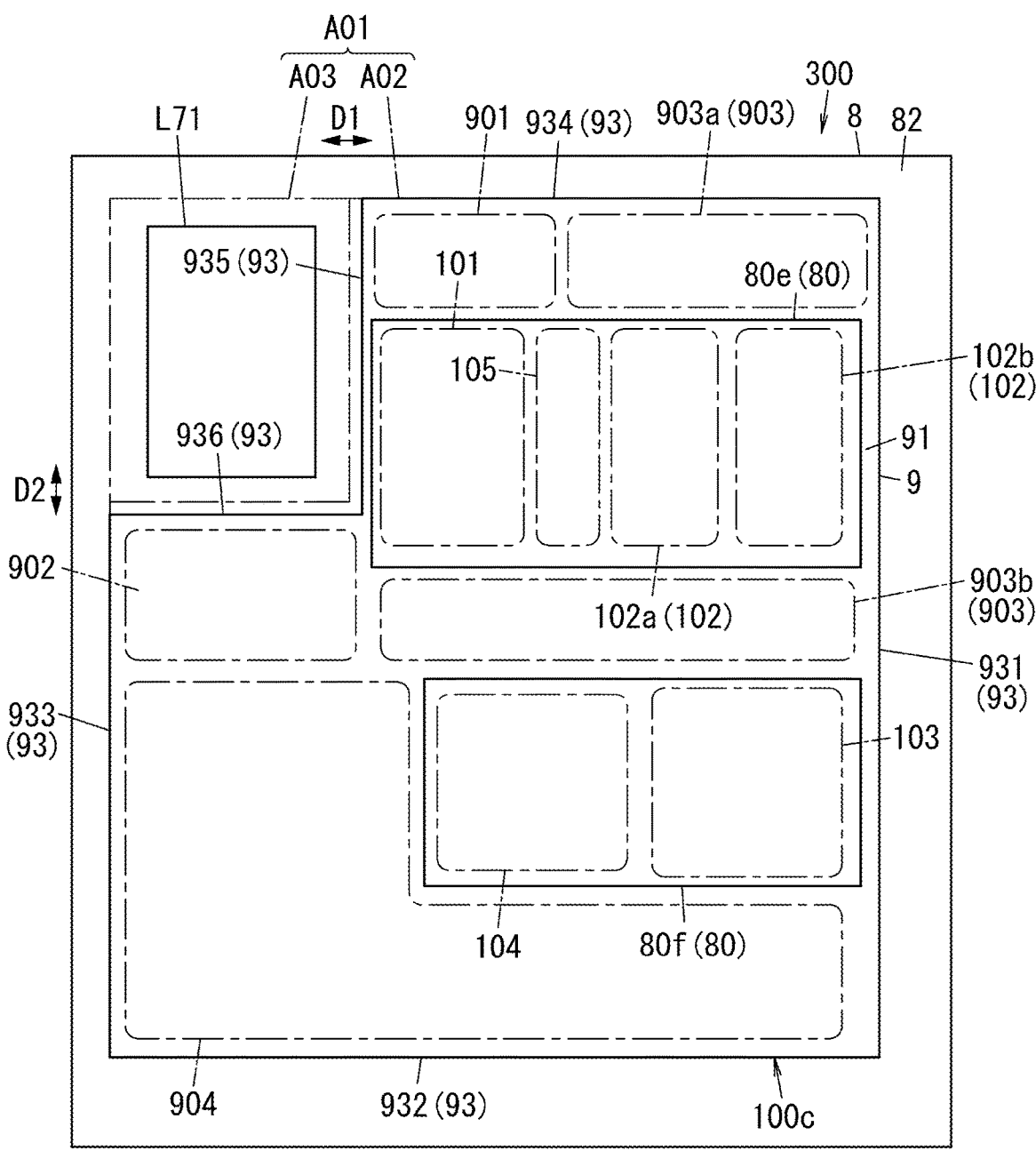
FIG. 13 is a plan view of a power supply system according to exemplary Embodiment 7.

In a power supply system 300 and a tracker module 100*c* according to Embodiment 7, the shape and structure of the tracker module 100*c* are as follows as illustrated in FIG. 13.

As illustrated in FIG. 13, the tracker module 100*c* according to Embodiment 7 includes two IC chips 80*e* and 80*f* as the IC chip 80.

The IC chip 80*e* of the two IC chips 80 is disposed on a first main surface 91 of a second board 9. As illustrated in FIG. 13, the IC chip 80*e* includes a PR switch portion 101, SC switch portions 102*a* and 102*b*, and a digital control unit 105. That is, the IC chip 80*e* includes switches S61 to S63, S71, and S72 (see FIG. 6) included in a pre-regulator circuit 10 (see FIG. 6) and switches S11 to S44 (see FIG. 6) included in a switched-capacitor circuit 20 (see FIG. 6).

The IC chip 80*f* is disposed on the first main surface 91 of the second board 9. As illustrated in FIG. 13, the IC chip 80*f* includes an SM switch portion 103 and a BS switch portion 104. That is, the IC chip 80*f* includes switches S51 to S54 (see FIG. 6) included in a supply modulator 30 (see FIG. 6).

Thus, the two IC chips 80 (80*e* and 80*f*) include the switches S61 to S63, S71, and S72 included in the pre-regulator circuit 10, the switches S11 to S44 included in the switched-capacitor circuit 20, and the switches S51 to S54 included in the supply modulator 30.

In the tracker module 100*c* according to Embodiment 7, in the plan view in a thickness direction D0 of the second board 9, the IC chip 80*e* is adjacent to a fifth side 935 that faces a power inductor L71 in a direction D1 in an outer edge 93 of the second board 9. More specifically, in the IC chip 80*e*, the PR switch portion 101 is adjacent to the fifth side 935 that faces the power inductor L71 in the direction D1 in the outer edge 93 of the second board 9. A PR capacitance portion 901 and a PR capacitance portion 902 are adjacent to the IC chip 80*e* in the plan view in the thickness direction D0 of the second board 9. As a result, in the tracker module 100*c* according to Embodiment 7, the wiring length of the pre-regulator circuit 10 can be shortened.

According to an exemplary aspect, the SC switch portion 102*a* of the IC chip 80*e* includes some of the plurality of switches S11 to S44 (see FIG. 6) of the switched-capacitor circuit 20. The SC switch portion 102*b* of the IC chip 80*d* includes switches that are not included in the SC switch portion 102*a* among the plurality of switches S11 to S44 of the switched-capacitor circuit 20. Specifically, the SC switch portion 102*a* of the IC chip 80*e* includes the switches S11, S12, S21, S22, S31, S32, S41, and S42. The SC switch portion 102*b* of the IC chip 80*e* includes the switches S13, S14, S23, S24, S33, S34, S43, and S44.

The plurality of capacitors C11 to C16 and C21 to C24 (see FIG. 6) included in the switched-capacitor circuit 20 are disposed in SC capacitance portions 903*a* and 903*b* on the first main surface 91 of the second board 9. According to an exemplary aspect, the capacitors C11 to C13 connected to the switches included in the SC switch portion 102*a* of the IC chip 80*e* are disposed in an SC capacitance portion 903*a*. The capacitors C14 to C16 connected to the switches included in the SC switch portion 102*b* of the IC chip 80*e* are disposed in the SC capacitance portion 903b. Each of the capacitors C21 to C24 is disposed in the SC capacitance portion 903b.

In the IC chip 80e, the SC switch portion 102a is adjacent to the PR switch portion 101. In the plan view in the thickness direction D0 of the second board 9, the SC switch portion 102a of the IC chip 80e is adjacent to the SC capacitance portion 903a and the SC capacitance portion 903b. In the plan view in the thickness direction D0 of the second board 9, the SC switch portion 102b of the IC chip 80e is adjacent to the SC capacitance portion 903a and the SC capacitance portion 903b. As a result, in the tracker module 100c according to Embodiment 7, it is possible to shorten the wiring length of the switched-capacitor circuit 20.

In the IC chip 80f, the SM switch portion 103 is adjacent to the BS switch portion 104. The SM switch portion 103 of the IC chip 80f is adjacent to the SC capacitance portion 903b in the plan view in the thickness direction D0 of the second board 9. The BS switch portion 104 of the IC chip 80f is adjacent to the filter circuit portion 904 in the plan view in the thickness direction D0 of the second board 9.

(2) Effects

In the power supply system 300 according to Embodiment 7, the tracker module 100c includes the two IC chips 80e and 80f. Each of the switches S61 to S63, S71, and S72 included in the pre-regulator circuit 10, the switches S11 to S44 included in the switched-capacitor circuit 20, and the switches S51 to S53 included in the supply modulator 30 is included in at least one of the IC chips 80e and 80f. In this case, similarly to Embodiment 1, in the power supply system 300, the positional relationship between the tracker module 100c and the power inductor L71 is limited. Thus, in the power supply system 300, an unnecessary space is less likely to occur between the tracker module 100c and the power inductor L71. Therefore, the size of the power supply system 300 including the power inductor L71 and the tracker module 100c can be reduced.

Exemplary Embodiment 8

(1) Configuration

Figure 14:
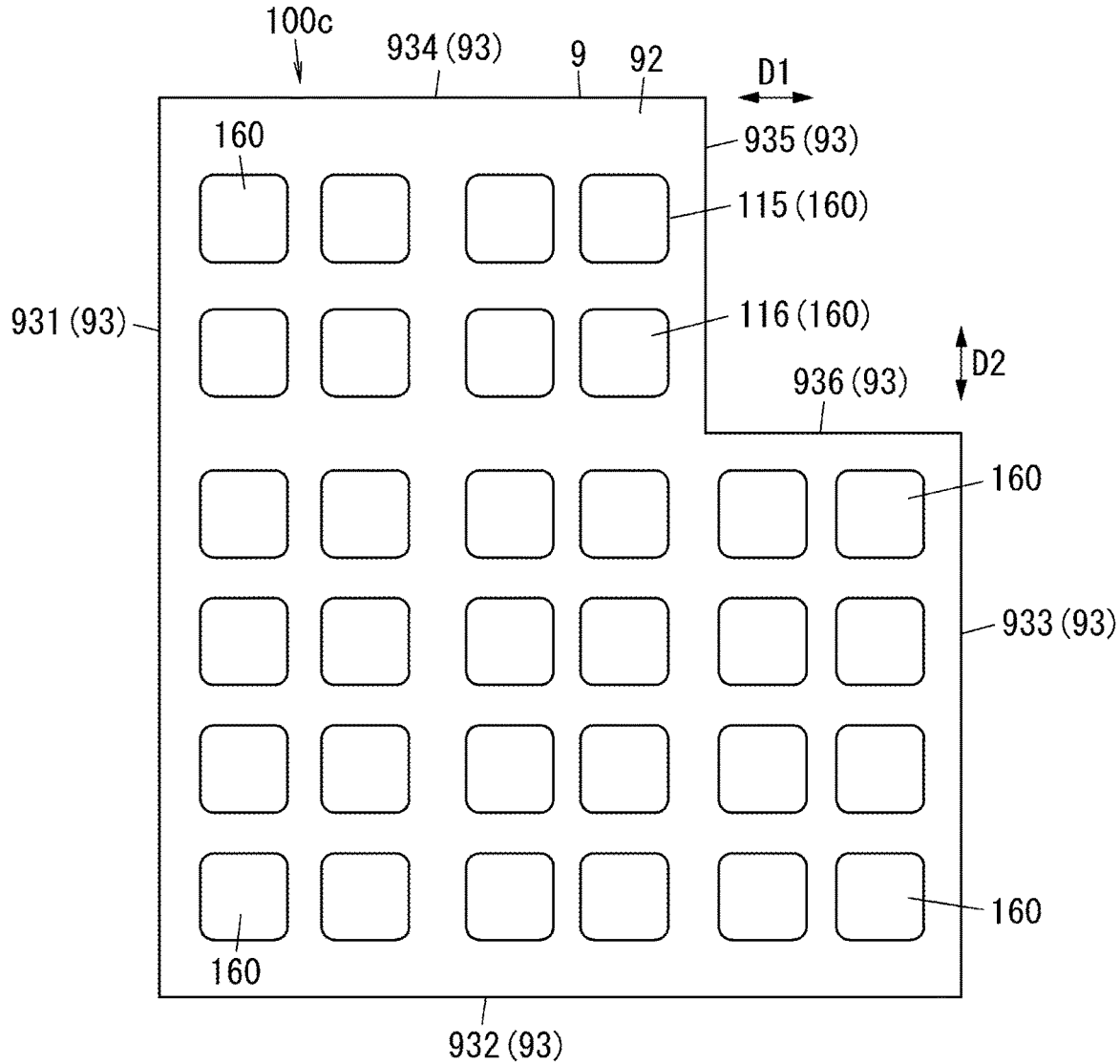
FIG. 14 is a rear view of a tracker module according to exemplary Embodiment 8.

In a power supply system 300 and a tracker module 100c according to Embodiment 8, the external connection terminal 160 has a disposition described below as illustrated in FIG. 14, in the tracker module 100c in Embodiment 7.

In the tracker module 100c according to Embodiment 8, the external connection terminal 160 includes the plurality of (two in FIG. 14) inductor connection terminals 115 and 116. As illustrated in FIG. 14, the external connection terminal 160 is disposed on the second main surface 92 of the second board 9.

In the tracker module 100c according to Embodiment 8, the inductor connection terminals 115 and 116 are adjacent to the fifth side 935 that faces the power inductor L71 in the outer edge 93 of the second board 9 in the direction D1. Thus, in a pre-regulator circuit 10, it is possible to shorten both a wiring length between the inductor connection terminal 115 and the power inductor L71 and a wiring length between the inductor connection terminal 116 and the power inductor L71. Therefore, the noise resistance performance of the pre-regulator circuit 10 is improved.

In the tracker module 100c according to Embodiment 8, as illustrated in FIG. 13, the IC chip 80e is adjacent to the fifth side 935 that faces the power inductor L71 in the outer edge 93 of the second board 9. In the tracker module 100c according to Embodiment 8, as illustrated in FIG. 13, the PR switch portion 101 is adjacent to the fifth side 935 that faces the power inductor L71 in the outer edge 93 of the second board 9. That is, the switches S61 to S63, S71, and S72 included in the pre-regulator circuit 10 are adjacent to the fifth side 935 that faces the power inductor L71 in the outer edge of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

(2) Effects

In the power supply system 300 according to Embodiment 8, the tracker module 100c includes the inductor connection terminals 115 and 116 that are connected to the power inductor L71. The inductor connection terminals 115 and 116 are adjacent to the fifth side 935 that faces the power inductor L71 in the outer edge 93 of the second board 9 in the direction D1. As a result, in the pre-regulator circuit 10, it is possible to shorten both the wiring length between the inductor connection terminal 115 and the power inductor L71 and the wiring length between the inductor connection terminal 116 and the power inductor L71. Therefore, the noise resistance performance of the pre-regulator circuit 10 is improved.

In the power supply system 300 according to Embodiment 8, the inductor connection terminals 115 and 116 are connected to the switches S61 to S63, S71, and S72 included in the pre-regulator circuit 10, whereby the noise resistance performance of the pre-regulator circuit 10 is further improved.

In the power supply system 300 according to Embodiment 8, the IC chip 80e is adjacent to the fifth side 935 that faces the power inductor L71 in the outer edge 93 of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

In the power supply system 300 according to Embodiment 8, the switches S61 to S63 included in the pre-regulator circuit 10 are adjacent to the fifth side 935 that faces the power inductor L71 in the outer edge 93 of the second board 9. Thus, in the pre-regulator circuit 10, it is possible to further shorten the wiring length between the inductor connection terminal 115 and the power inductor L71 and the wiring length between the inductor connection terminal 116 and the power inductor L71.

Exemplary Embodiment 9

Figure 15:
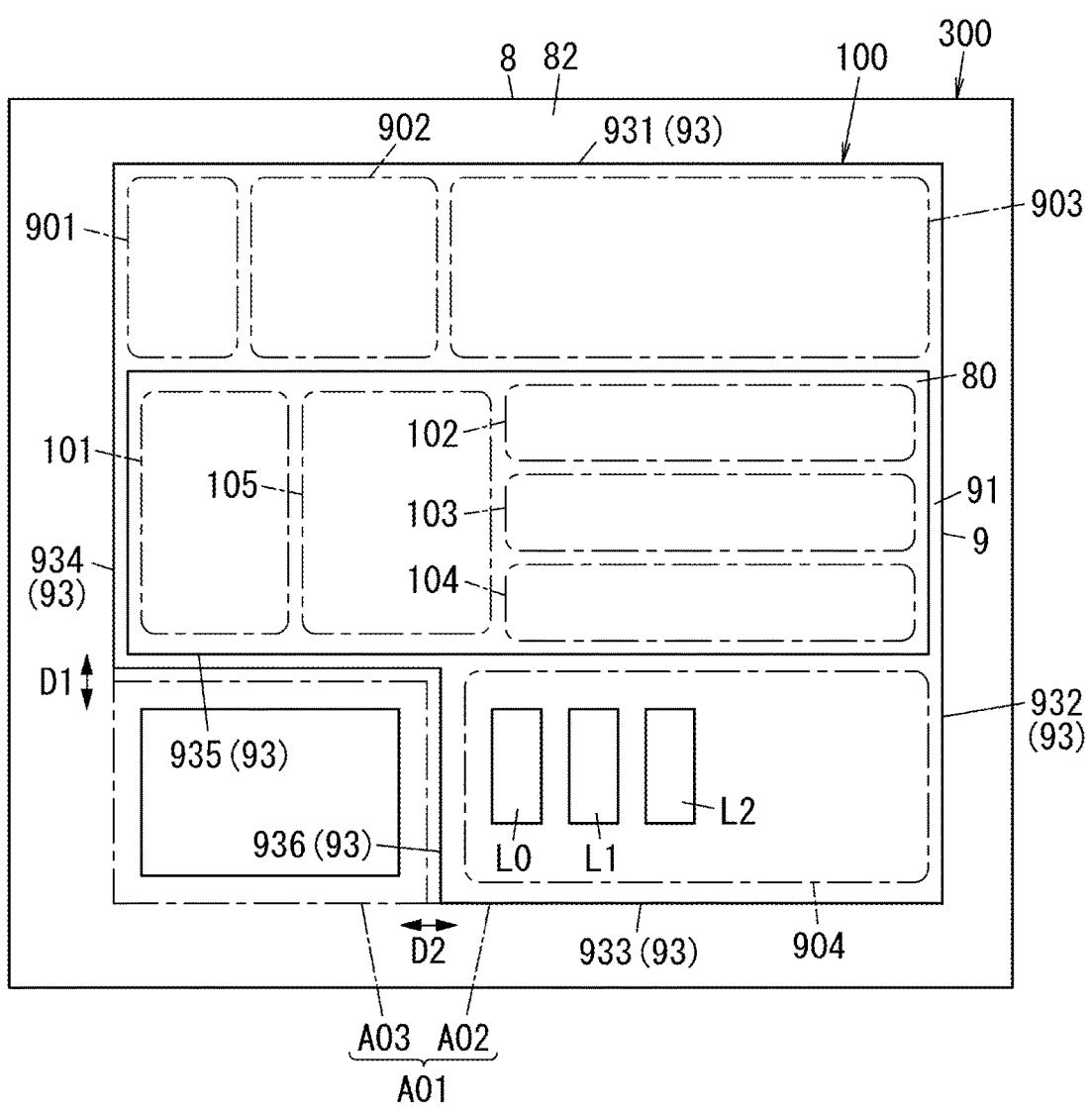
FIG. 15 is a plan view of a power supply system according to exemplary Embodiment 9.

In a power supply system 300 and a tracker module 100 according to Embodiment 9, in the tracker module 100 in Embodiment 1, the inductors L0 to L2 included in the filter circuit portion 904 have a disposition described below, as illustrated in FIG. 15.

In the tracker module 100 according to Embodiment 9, the plurality of inductors L0 to L2 (see FIG. 6) included in the filter circuit 40 (see FIG. 6) are disposed in the filter circuit portion 904 on the first main surface 91 of the second board 9. Each of the inductors L0 to L2 has a magnetic flux direction that is perpendicular to the magnetic flux direction of the power inductor L71. For purposes of this disclosure, the term "magnetic flux direction of the inductor" means an extending direction of a winding axis of the inductor. That is, the phrase that "the inductor L0 has a magnetic flux direction that is perpendicular to the magnetic flux direction of the power inductor L71" means that the absolute value of the difference between 90° and an angle formed between the extending direction of the winding axis of the inductor L0 and the extending direction of the winding axis of the power inductor L71 is equal to or smaller than 20°.

More specifically, as illustrated in FIG. 15, the extending direction of the winding axis of the inductor L0 and the extending direction of the winding axis of the power inductor L71 are perpendicular to each other. According to an exemplary aspect, the extending direction of the winding axis of the inductor L0 is parallel to the longitudinal direction of the inductor L0 having a rectangular shape, and for example, parallel to the direction D1. The extending direction of the winding axis of the power inductor L71 is parallel to the longitudinal direction of the power inductor L71 having a rectangular shape, for example, parallel to the direction D2. Similarly, the extending direction of the winding axis of the inductor L1 and the extending direction of the winding axis of the power inductor L71 are perpendicular to each other. The extending direction of the winding axis of the inductor L2 and the extending direction of the winding axis of the power inductor L71 are perpendicular to each other. As a result, it is possible to reduce the magnetic coupling between the power inductor L71 included in the pre-regulator circuit 10 and the inductors L0 to L2 included in the filter circuit 40. Thus, it is possible to reduce the deterioration in the filter characteristic of the filter circuit 40 due to the power inductor L71.

In the power supply system 300 according to Embodiment 9, the tracker module 100 includes the filter circuit 40. The filter circuit 40 is connected to the supply modulator 30 and outputs the power supply voltage Vcc to the power amplifier 2. The filter circuit 40 includes the inductors L0 to L2. The magnetic flux direction of each of the inductors L0 to L2 is perpendicular to the magnetic flux direction of the power inductor L71. As a result, it is possible to reduce the magnetic coupling between the power inductor L71 included in the pre-regulator circuit 10 and the inductors L0 to L2 included in the filter circuit 40. Thus, the deterioration in the filter characteristic of the filter circuit 40 due to the power inductor L71 can be reduced.

Modifications of the exemplary embodiments will be described below.

In Embodiments 2 and 8, the plurality of inductor connection terminals 115 and 116 are adjacent to the fifth side 935 of the second board 9. As long as at least one of the plurality of inductor connection terminals 115 and 116 is adjacent to the fifth side 935, the other one does not need to be adjacent to the fifth side 935. In Embodiment 4, the plurality of inductor connection terminals 115 and 116 are adjacent to the sixth side 936 of the second board 9. As long as at least one of the plurality of inductor connection terminals 115 and 116 is adjacent to the sixth side 936 of the second board 9, the other one does not need to be adjacent to the sixth side 936. In Embodiment 6, the inductor connection terminal 115 is adjacent to the fifth side 935 of the second board 9, and the inductor connection terminal 116 is adjacent to the sixth side 936 of the second board 9. As long as at least one of the plurality of inductor connection terminals 115 and 116 is adjacent to either the fifth side 935 or the sixth side 936 of the second board 9, the other one does not need to be adjacent to the fifth side 935 and the sixth side 936 of the second board 9.

In Embodiments 1, 2, and 9, the IC chip 80 includes the switches S61 to S63, S71, and S72 included in the pre-regulator circuit 10, but may include some of the switches S61 to S63, S71, and S72. The IC chip 80 includes the switches S11 to S44 included in the switched-capacitor circuit 20, but may include some of the switches S11 to S44. The IC chip 80 includes the switches S51 to S54 included in the supply modulator 30, but may include some of the switches S51 to S54.

Similarly, in Embodiments 3 and 4, at least one of the IC chips 80a and 80b only needs to include some of the switches S61 to S63, S71, and S72 included in the pre-regulator circuit 10. At least one of the IC chips 80a and 80b only needs to include some of the switches S11 to S44 included in the switched-capacitor circuit 20. At least one of the IC chips 80a and 80b only needs to include some of the switches S51 to S54 included in the supply modulator 30. The same applies to Embodiments 5 to 8.

In Embodiments 1, 2, and 9, the tracker module 100 includes one IC chip 80, but may include two or more IC chips 80. Similarly, the tracker modules 100a to 100c according to Embodiments 3 to 8 include two IC chips 80, but may include three or more IC chips 80 or may include one IC chip 80.

In Embodiment 10, the winding axis of each of the inductors L0 to L2 included in the filter circuit 40 is perpendicular to the winding axis of the power inductor L71. As long as the winding axis of one or two of the inductors L0 to L2 is perpendicular to the winding axis of the power inductor L71, the winding axes of the other inductors do not necessarily be perpendicular to the winding axis of the power inductor L71.

Additional Exemplary Aspects

The following aspects are disclosed in the present specification.

A power supply system (300) according to a first aspect includes a first board (8), a tracker module (100 to 100c), and a power inductor (L71). The tracker module (100 to 100c) is disposed at the first board (8). The power inductor (L71) is disposed at the first board (8). The tracker module (100 to 100c) includes a second board (9) and at least one IC chip (80; 80a, 80b; 80c, 80d; 80e, 80f). The at least one IC chip (80; 80a, 80b; 80c, 80d; 80e, 80f) includes at least one of switches (S61 to S63, S71, and S72) included in a pre-regulator circuit (10), at least one of switches (S11 to S44) included in a switched-capacitor circuit (20), and at least one of switches (S51 to S54) included in a supply modulator (30). The pre-regulator circuit (10) is configured to convert an input voltage into an adjustment voltage by using a power inductor (L71). The switched-capacitor circuit (20) is configured to generate a plurality of discrete voltages based on the adjustment voltage. The supply modulator (30) is configured to selectively output at least one of the plurality of discrete voltages to a power amplifier (2). Moreover, the second board (9) has a recess (A03) in the plan view in a thickness direction (D0) of the first board (8). At least a portion of the power inductor (L71) is disposed in the recess (A03).

According to the power supply system (300) according to the above aspect, the size of the power supply system (300) including the tracker module (100 to 100c) and the power inductor (L71) can be reduced.

A power supply system (300) according to a second aspect includes a first board (8), a tracker module (100 to 100c), and a power inductor (L71). The tracker module (100 to 100c) is disposed at the first board (8). The power inductor (L71) is disposed at the first board (8). The tracker module (100 to 100c) includes a second board (9) and at least one IC chip (80; 80a, 80b; 80c, 80d; 80e, 80f). The at least one IC chip (80; 80a, 80b; 80c, 80d; 80e, 80f) includes at least one of switches (S61 to S63, S71, and S72) included in a pre-regulator circuit (10), at least one of switches (S11 to S44) included in a switched-capacitor circuit (20), and at least one of switches (S51 to S54) included in a supply modulator (30). The pre-regulator circuit (10) is configured to convert an input voltage into an adjustment voltage by using a power inductor (L71). The switched-capacitor circuit (20) is configured to generate a plurality of discrete voltages based on the adjustment voltage. The supply modulator (30) is configured to selectively output at least one of the plurality of discrete voltages to a power amplifier (2). In the plan view in the thickness direction (D0) of the first board (8), the tracker module (100 to 100c) and the power inductor (L71) face each other in a first direction (D1) and face each other in a second direction (D2). The first direction (D1) is perpendicular to the thickness direction (D0) of the first board (8). The second direction (D2) is perpendicular to the thickness direction (D0) of the first board (8) and the first direction (D1).

According to the power supply system (300) according to the above aspect, an unnecessary space is less likely to occur between the tracker module (100 to 100c) and the power inductor (L71). Thus, the size of the power supply system (300) including the tracker module (100 to 100c) and the power inductor (L71) can be reduced.

In a power supply system (300) according to a third aspect, in the first or second aspect, the tracker module (100 to 100c) further includes a connection terminal (115, 116) connected to the power inductor (L71). The connection terminal (115, 116) is adjacent to a portion (935, 936) of an outer edge (93) of the second board (9), which faces the power inductor (L71).

According to the power supply system (300) according to the above aspect, in the pre-regulator circuit (10), it is possible to shorten both a wiring length between the connection terminal (115) and the power inductor (L71), and a wiring length between the connection terminal (116) and the power inductor (L71). Thus, the noise resistance performance of the pre-regulator circuit (10) is improved.

In a power supply system (300) according to a fourth aspect, in the third aspect, the connection terminal (115, 116) is connected to at least one of the switches (S61 to S63, S71, S72) included in the pre-regulator circuit (10).

According to the power supply system (300) according to the above aspect, it is possible to further shorten the wiring length of the pre-regulator circuit (10), so that the noise resistance performance of the pre-regulator circuit (10) is further improved.

In a power supply system (300) according to a fifth aspect, in the third or fourth aspect, the at least one IC chip (80; 80a; 80c, 80d; 80e) is adjacent to a portion (935, 936) of the outer edge (93) of the second board (9), which faces the power inductor (L71).

According to the power supply system (300) according to the above aspect, it is possible to further shorten the wiring length of the pre-regulator circuit (10), so that the noise resistance performance of the pre-regulator circuit (10) is further improved.

In a power supply system (300) according to a sixth aspect, in the fifth aspect, the at least one switch (S61 to S63, S71, S72) included in the pre-regulator circuit (10) is adjacent to the portion (935, 936) of the outer edge (93) of the second board (9), which faces the power inductor (L71).

According to the power supply system (300) according to the above aspect, since the distance between the power inductor (L71) and the at least one switch (S61 to S63, S71, S72) included in the pre-regulator circuit (10) is short, the wiring length of the pre-regulator circuit (10) can be shortened.

In a power supply system (300) according to a seventh aspect, in any one of the first to sixth aspects, in the plan view in the thickness direction (D0) of the first board (8), the tracker module (100 to 100c) and the power inductor (L71) are located inside a rectangular first region (A01).

According to the power supply system (300) according to the above aspect, the tracker module (100 to 100c) and the power inductor (L71) can be regarded as one rectangular device, so that it is possible to further reduce the size of the power supply system (300).

In a power supply system (300) according to an eighth aspect, in the seventh aspect, in the plan view in the thickness direction (D0) of the first board (8), the power inductor (L71) is located inside the second region (A03) that is a portion of the first region (A01). The second region (A03) is in contact with one side of the first region (A01) in the plan view in the thickness direction (D0) of the first board (8).

According to the power supply system (300) according to the above aspect, since a portion of the outer peripheral surface of the power inductor (L71) does not face the tracker module (100 to 100c), it is possible to secure the heat dissipation properties of the power inductor L71.

In a power supply system (300) according to a ninth aspect, in the eighth aspect, in the plan view in the thickness direction (D0) of the first board (8), the second region (A03) includes one of four vertices of the first region (A01).

According to the power supply system (300) according to the above aspect, it is possible to make the shape of the tracker module (100 to 100c) be a simple shape such as an L-shape in the plan view in the thickness direction (D0) of the first board (8).

In a power supply system (300) according to a tenth aspect, in any one of the first to ninth aspects, the tracker module (100) further includes a filter circuit (40). The filter circuit (40) is connected to the supply modulator (30). The filter circuit (40) includes at least one inductor (L0 to L2). A magnetic flux direction of at least one of the inductors (L0 to L2) is perpendicular to a magnetic flux direction of the power inductor (L71).

According to the power supply system (300) according to the above aspect, it is possible to reduce the magnetic coupling between the power inductor (L71) included in the pre-regulator circuit (10) and the inductor (L0 to L2) included in the filter circuit (40). Thus, it is possible to reduce the deterioration in the filter characteristic of the filter circuit (40) due to the power inductor (L71).

A radio frequency system (200) according to an eleventh aspect includes the power supply system (300) according to any one of the first to tenth aspects, and a power amplifier (2). The power amplifier (2) is connected to the tracker module (100 to 100c).

According to the radio frequency system (200) according to the above aspect, in the power supply system (300), a positional relationship between the tracker module (100 to 100c) and the power inductor (L71) is limited. Thus, in the power supply system (300), an unnecessary space is less likely to occur between the tracker modules (100 to 100c) and the power inductor (L71). Thus, it is possible to reduce the size of the power supply system (300) including the tracker module (100 to 100c) and the power inductor (L71).

A communication device (7) according to a twelfth aspect includes the radio frequency system (200) according to the eleventh aspect, and a signal processing circuit (5). The signal processing circuit (5) is connected to the radio frequency system (200).

According to the communication device (7) according to the above aspect, in the power supply system (300), the positional relationship between the tracker module (100 to 100c) and the power inductor (L71) is limited. Thus, in the power supply system (300), an unnecessary space is less likely to occur between the tracker modules (100 to 100c) and the power inductor (L71). Thus, the size of the power supply system (300) including the tracker module (100 to 100c) and the power inductor (L71) can be reduced.

A tracker module (100 to 100c) according to a thirteenth aspect includes a module laminate (9) and at least one IC chip (80; 80a, 80b; 80c, 80d; 80e, 80f). The at least one IC chip (80; 80a, 80b; 80c, 80d; 80e, 80f) includes at least one of switches (S61 to S63, S71, and S72) included in a pre-regulator circuit (10), at least one of switches (S11 to S44) included in a switched-capacitor circuit (20), and at least one of switches (S51 to S54) included in a supply modulator (30). The pre-regulator circuit (10) is configured to convert an input voltage into an adjustment voltage by using a power inductor (L71). The switched-capacitor circuit (20) is configured to generate a plurality of discrete voltages based on the adjustment voltage. The supply modulator (30) is configured to selectively output at least one of the plurality of discrete voltages to a power amplifier (2). The module laminate (9) has a recess (A03) in the plan view in a thickness direction (D0) of the module laminate (9). At least a portion of the power inductor (L71) is disposed in the recess (A03) in the plan view in the thickness direction (D0) of the module laminate (9).

According to the tracker module (100 to 100c) according to the above aspect, it is possible to reduce the size of the power supply system (300) including the tracker module (100 to 100c) and the power inductor (L71).

A tracker module (100; 100a) according to a fourteenth aspect, in the thirteenth aspect, further includes a connection terminal (115, 116) connected to the power inductor (L71). The connection terminal (115, 116) is adjacent to a portion (935, 936) of an outer edge (93) of the module laminate (9), which faces the power inductor (L71).

According to the tracker module (100; 100a) according to the above aspect, in the pre-regulator circuit (10), it is possible to shorten both a wiring length between the connection terminal (115) and the power inductor (L71), and a wiring length between the connection terminal (116) and the power inductor (L71). Thus, the noise resistance performance of the pre-regulator circuit (10) is improved.

In a tracker module (100; 100a) according to a fifteenth aspect, in the fourteenth aspect, the connection terminal (115, 116) is connected to at least one of the switches (S61 to S63, S71, S72) included in the pre-regulator circuit (10).

According to the tracker module (100; 100a) according to the above aspect, it is possible to further shorten the wiring length of the pre-regulator circuit (10), so that the noise resistance performance of the pre-regulator circuit (10) is further improved.

In a tracker module (100; 100a) according to a sixteenth aspect, in the fourteenth or fifteenth aspect, the at least one IC chip (80; 80a; 80c, 80d; 80e) is adjacent to a portion (935, 936) of the outer edge (93) of the module laminate (9), which faces the power inductor (L71).

According to the tracker module (100; 100a) according to the above aspect, it is possible to further shorten the wiring length of the pre-regulator circuit (10), so that the noise resistance performance of the pre-regulator circuit (10) is further improved.

In a tracker module (100; 100a) according to a seventeenth aspect, in the sixteenth aspect, the at least one switch (S61 to S63, S71, S72) included in the pre-regulator circuit (10) is adjacent to the portion (935, 936) of the outer edge (93) of the module laminate (9), which faces the power inductor (L71).

According to the tracker module (100; 100a) according to the above aspect, since the distance between the power inductor (L71) and the at least one switch (S61 to S63, S71, S72) included in the pre-regulator circuit (10) is short, the wiring length of the pre-regulator circuit (10) can be shortened.

In a tracker module (100; 100a) according to an eighteenth aspect, in any one of the thirteenth to seventeenth aspects, in the plan view in the thickness direction (D0) of the first board (8), the tracker module (100 to 100c) and the power inductor (L71) are located inside a rectangular first region (A01).

According to the tracker module (100; 100a) according to the above aspect, the tracker module (100 to 100c) and the power inductor (L71) can be regarded as one rectangular device, so that it is possible to further reduce the size of the power supply system (300).

In a tracker module (100; 100a) according to a nineteenth aspect, in the eighteenth aspect, in the plan view in the thickness direction (D0) of the first board (8), the power inductor (L71) is located inside the second region (A03) that is a portion of the first region (A01). The second region (A03) is in contact with one side of the first region (A01) in the plan view in the thickness direction (D0) of the first board (8).

According to the tracker module (100; 100a) according to the above aspect, since a portion of the outer peripheral surface of the power inductor (L71) does not face the tracker module (100 to 100c), it is possible to secure the heat dissipation properties of the power inductor (L71).

A tracker module (100; 100a) according to a twentieth aspect in any one of the thirteenth to nineteenth aspects further includes a filter circuit (40). The filter circuit (40) is connected to the supply modulator (30). The filter circuit (40) includes at least one inductor (L0 to L2). A magnetic flux direction of at least one of the inductors (L0 to L2) is perpendicular to a magnetic flux direction of the power inductor (L71).

According to the tracker module (100; 100a) according to the above aspect, it is possible to reduce the magnetic coupling between the power inductor (L71) included in the pre-regulator circuit (10) and the inductor (L0 to L2) included in the filter circuit (40). Thus, it is possible to reduce the deterioration in the filter characteristic of the filter circuit (40) due to the power inductor (L71).

What is claimed:
1. A power supply system comprising:
a first board;
a tracker module disposed at the first board; and
a power inductor disposed at the first board,
wherein the tracker module includes:
    a second board, and
    at least one IC chip disposed at the second board, wherein the at least one IC chip includes:

at least one switch included in a pre-regulator circuit that is configured to use the power inductor to convert an input voltage into an adjustment voltage, at least one switch included in a switched-capacitor circuit that is configured to generate a plurality of discrete voltages based on the adjustment voltage, and at least one switch included in a supply modulator that is configured to selectively output at least one of the plurality of discrete voltages to a power amplifier, and wherein, in a plan view in a thickness direction of the first board, the second board has a recess and at least a portion of the power inductor is disposed in the recess.

2. The power supply system according to claim 1, wherein the tracker module further includes a connection terminal connected to the power inductor and that is disposed adjacent to a portion of an outer edge of the second board that faces the power inductor.

3. The power supply system according to claim 2, wherein the connection terminal is connected to the at least one switch included in the pre-regulator circuit.

4. The power supply system according to claim 2, wherein the at least one IC chip is disposed adjacent to the portion of the outer edge of the second board that faces the power inductor.

5. The power supply system according to claim 4, wherein the at least one switch included in the pre-regulator circuit is disposed adjacent to the portion of the outer edge of the second board that faces the power inductor.

6. The power supply system according to claim 1, wherein in the plan view in the thickness direction of the first board, the tracker module and the power inductor are disposed inside a rectangular first region.

7. The power supply system according to claim 6, wherein, in the plan view in the thickness direction of the first board, the power inductor is located inside a second region that is a portion of the first region, and the second region is in contact with at least one side of the first region.

8. The power supply system according to claim 7, wherein, in the plan view in the thickness direction of the first board, the second region includes one of four vertices of the first region.

9. The power supply system according to claim 1, wherein:

the tracker module further includes a filter circuit that includes at least one inductor and that is connected to the supply modulator, and a magnetic flux direction of the at least one inductor is perpendicular to a magnetic flux direction of the power inductor.

10. A radio frequency system comprising:

the power supply system according to claim 1; and the power amplifier connected to the tracker module.

11. A communication device comprising:

the radio frequency system according to claim 10; and a signal processing circuit connected to the radio frequency system.

12. A power supply system comprising:

a first board;

a tracker module disposed at the first board; and a power inductor disposed at the first board, wherein the tracker module includes:

a second board, and at least one IC chip disposed at the second board, wherein the at least one IC chip includes:

at least one switch included in a pre-regulator circuit that is configured to use the power inductor to convert an input voltage into an adjustment voltage, at least one switch included in a switched-capacitor circuit that is configured to generate a plurality of discrete voltages based on the adjustment voltage, and at least one switch included in a supply modulator that is configured to selectively output at least one of the plurality of discrete voltages to a power amplifier, and wherein, in a plan view in a thickness direction of the first board, the tracker module and the power inductor face each other in a first direction that is perpendicular to the thickness direction of the first board, and face each other in a second direction that is perpendicular to the thickness direction of the first board and the first direction.

13. A tracker module comprising:

a module laminate; and at least one IC chip disposed at the module laminate, wherein the at least one IC chip includes:

at least one switch included in a pre-regulator circuit that is configured to use a power inductor to convert an input voltage into an adjustment voltage, at least one switch included in a switched-capacitor circuit that is configured to generate a plurality of discrete voltages based on the adjustment voltage, and at least one switch included in a supply modulator that is configured to selectively output at least one of the plurality of discrete voltages to a power amplifier, and wherein, in a plan view in a thickness direction of the module laminate, the module laminate has a recess, and at least a portion of the power inductor is disposed in the recess.

14. The tracker module according to claim 13, further comprising a connection terminal connected to the power inductor and that is disposed adjacent to a portion of an outer edge of the module laminate that faces the power inductor.

15. The tracker module according to claim 14, wherein the connection terminal is connected to the at least one switch included in the pre-regulator circuit.

16. The tracker module according to claim 14, wherein the at least one IC chip is disposed adjacent to the portion of the outer edge of the module laminate that faces the power inductor.

17. The tracker module according to claim 16, wherein the at least one switch included in the pre-regulator circuit is adjacent to the portion of the outer edge of the module laminate that faces the power inductor.

18. The tracker module according to claim 13, wherein, in the plan view in the thickness direction of the module laminate, the tracker module and the power inductor are located inside a rectangular first region.

19. The tracker module according to claim 18, wherein, in the plan view in the thickness direction of the module laminate, the power inductor is located inside a second region that is a portion of the first region, and the second region is in contact with at least one side of the first region.

20. The tracker module according to claim 13, further comprising:

a filter circuit that includes at least one inductor and that is connected to the supply modulator, wherein a magnetic flux direction of the at least one inductor is perpendicular to a magnetic flux direction of the power inductor.

\* \* \* \* \*